US012464698B2

(12) United States Patent
Choi et al.

(10) Patent No.: US 12,464,698 B2
(45) Date of Patent: Nov. 4, 2025

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Eunsuk Choi, Suwon-si (KR); Yeram Kim, Suwon-si (KR); Siwoo Kim, Suwon-si (KR); Jinah Kim, Suwon-si (KR); Hyongsoo Kim, Suwon-si (KR); Seonbaek Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 453 days.

(21) Appl. No.: 18/125,776

(22) Filed: Mar. 24, 2023

(65) Prior Publication Data

US 2024/0090192 A1    Mar. 14, 2024

(30) Foreign Application Priority Data

Sep. 13, 2022  (KR) .......................... 10-2022-0115000

(51) Int. Cl.
*H10B 12/00* (2023.01)
*H10D 1/68* (2025.01)

(52) U.S. Cl.
CPC ......... *H10B 12/033* (2023.02); *H10B 12/315* (2023.02); *H10B 12/482* (2023.02); *H10D 1/716* (2025.01)

(58) Field of Classification Search
CPC .. H10B 12/033; H10B 12/315; H10B 12/482; H10B 12/30; H10B 12/02; H10B 12/03; H10D 1/716; H10D 1/696
See application file for complete search history.

(56) References Cited

U.S. PATENT DOCUMENTS

| | | | |
|---|---|---|---|
| 10,283,509 B2 | 5/2019 | Pak et al. | |
| 10,685,877 B2 | 6/2020 | Kim | |
| 10,714,565 B2 | 7/2020 | Nam et al. | |
| 11,723,185 B2 * | 8/2023 | Chen | H10D 1/692 |
| 2013/0250477 A1 | 9/2013 | Lim | |
| 2018/0019243 A1 | 1/2018 | Kim et al. | |

(Continued)

FOREIGN PATENT DOCUMENTS

| | | |
|---|---|---|
| KR | 10-2018-0007171 A | 1/2018 |
| KR | 10-2018-0065425 A | 6/2018 |

(Continued)

*Primary Examiner* — David Vu
(74) *Attorney, Agent, or Firm* — Muir Patent Law, PLLC

(57) ABSTRACT

A semiconductor device may include an active pattern, a capacitor contact structure electrically connected to the active pattern, and a capacitor structure electrically connected to the capacitor contact structure. The capacitor structure may include a first lower electrode and a second lower electrode that are adjacent to each other, a supporter supporting the first and second lower electrodes, a capacitor insulating layer covering the first and second lower electrodes, and an upper electrode on the capacitor insulating layer. The supporter may include a first supporter curved sidewall connected to the first lower electrode and the second lower electrode, and the upper electrode may include an intervening electrode portion enclosed by the supporter. The first supporter curved sidewall may be convex toward the intervening electrode portion.

20 Claims, 24 Drawing Sheets

(56) References Cited

U.S. PATENT DOCUMENTS

| | | |
|---|---|---|
| 2018/0158827 A1 | 6/2018 | You et al. |
| 2020/0194437 A1 | 6/2020 | Song et al. |
| 2021/0296322 A1 | 9/2021 | Lee et al. |
| 2022/0130950 A1 | 4/2022 | Cho et al. |
| 2022/0344346 A1 | 10/2022 | Lee et al. |

FOREIGN PATENT DOCUMENTS

| | | |
|---|---|---|
| KR | 10-2018-0066523 A | 6/2018 |
| KR | 10-2018-0068584 A | 6/2018 |
| KR | 10-2021-0018683 A | 2/2021 |
| KR | 10-2021-0117794 A | 9/2021 |

\* cited by examiner

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2022-0115000, filed on Sep. 13, 2022, in the Korean Intellectual Property Office, the entire contents of which are hereby incorporated by reference.

BACKGROUND

1. Field

The present disclosure relates to a semiconductor device and a method of fabricating the same, and in particular, to a semiconductor device including a capacitor structure and a method of fabricating the same.

2. Description of the Related Art

Due to their small-sized, multifunctional, and/or low-cost characteristics, semiconductor devices are being praised as important elements in the electronics industry. The semiconductor devices may be classified into a semiconductor memory device for storing data, a semiconductor logic device for processing data, and a hybrid semiconductor device including both of memory and logic elements.

With the recent trend of high speed and low power consumption in electronic devices, it is desirable that semiconductor devices in the electronic devices also have high operating speeds and/or low operating voltages. In order to satisfy this requirement, it is desirable that an integration density of semiconductor devices be increased. However, when the integration density of a semiconductor device increases, there is a possibility that the semiconductor device could suffer from deterioration in electrical characteristics and production yield. Accordingly, many studies are being conducted to improve the electrical characteristics and production yield of semiconductor devices.

SUMMARY

Embodiments may be directed to a semiconductor device including an active pattern, a capacitor contact structure electrically connected to the active pattern; and a capacitor structure electrically connected to the capacitor contact structure. The capacitor structure includes a first lower electrode, a second lower electrode, which are adjacent to each other, a first supporter supporting the first to third lower electrodes, a capacitor insulating layer covering the first and second lower electrodes, and an upper electrode on the capacitor insulating layer, and wherein the supporter includes a first supporter curved sidewall connected to the first lower electrode and the second lower electrode, the upper electrode includes an intervening electrode portion enclosed by the supporter, and the first supporter curved sidewall is convex toward the intervening electrode portion.

Embodiments are further directed to a semiconductor device including an active pattern, a capacitor contact structure electrically connected to the active pattern, and a capacitor structure electrically connected to the capacitor contact structure. The capacitor structure includes a first lower electrode, a second lower electrode, and a third lower electrode that are adjacent to each other. A first supporter supports the first to third lower electrodes. A capacitor insulating layer covers the first to third electrodes, and an upper electrode is on the capacitor insulating layer. The first supporter includes a first supporter curved sidewall connected to the first lower electrode and the second lower electrode and a second supporter curved sidewall that is connected to the first lower electrode and the second lower electrode, and a second supporter curved sidewall that is connected to the first lower electrode and the third lower electrode. A distance between the first supporter curved sidewall and the second supporter curved sidewall decreases as a vertical level is lowered.

According to an embodiment, a semiconductor device includes a substrate including an active pattern, a gate structure on the active pattern, a bit line structure on the active pattern, a capacitor contact structure electrically connected to the capacitor contact structure. The capacitor structure includes a first lower electrode, a second lower electrode, and a third lower electrode that are adjacent to each other. A supporter supporting the first to third lower electrodes, a capacitor insulating layer covering the first to third lower electrodes, and an upper electrode on the capacitor insulating layer. The supporter includes a first supporter curved sidewall connected to the first lower electrode and the second lower electrode, a second supporter curved sidewall connected to the second lower electrode and the third lower electrode. The upper electrode includes an intervening electrode portion enclosed by the first to third supporter curved sidewalls and the first to third lower electrodes. The first to third supporter curved sidewalls are convex toward the intervening electrode portion.

According to an embodiment, a method of fabricating a semiconductor device includes forming sacrificial layers and supporters, forming a lower electrode to pass through the sacrificial layers and the supporters, forming a mask structure on the lower electrode, forming a photoresist pattern, which includes an opening, on the mask structure, etching the mask structure using the photoresist pattern as an etch mask, etching the sacrificial layers and the supporters using the etched mask structure as an etch mask to form a hole, forming a capacitor insulating layer to cover the lower electrode, and forming an upper electrode on the capacitor insulating layer. The supporters include a first supporter, which is the uppermost one of the supporters. The hole includes a first portion, which is disposed at the same level as the first supporter, and a second portion, which is disposed below the first portion. The first supporter includes a supporter curved sidewall that is convex toward the first portion of the hole.

BRIEF DESCRIPTION OF THE DRAWINGS

Features will become apparent to those of skill in the art by describing in detail exemplary embodiments with reference to the attached drawings in which.

DETAILED DESCRIPTION

Figure 1A:
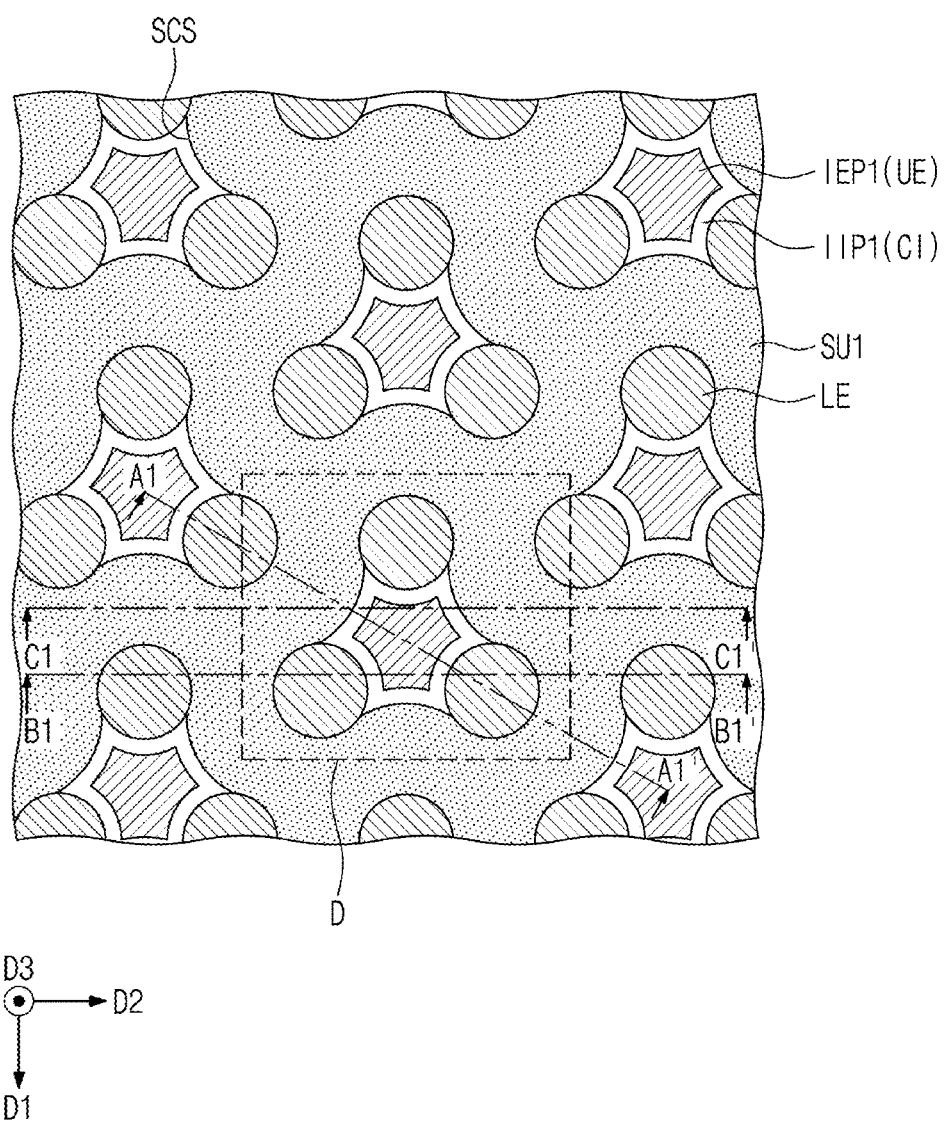
FIG. 1A is a plan view illustrating a semiconductor device according to an embodiment.
Figure 1B:
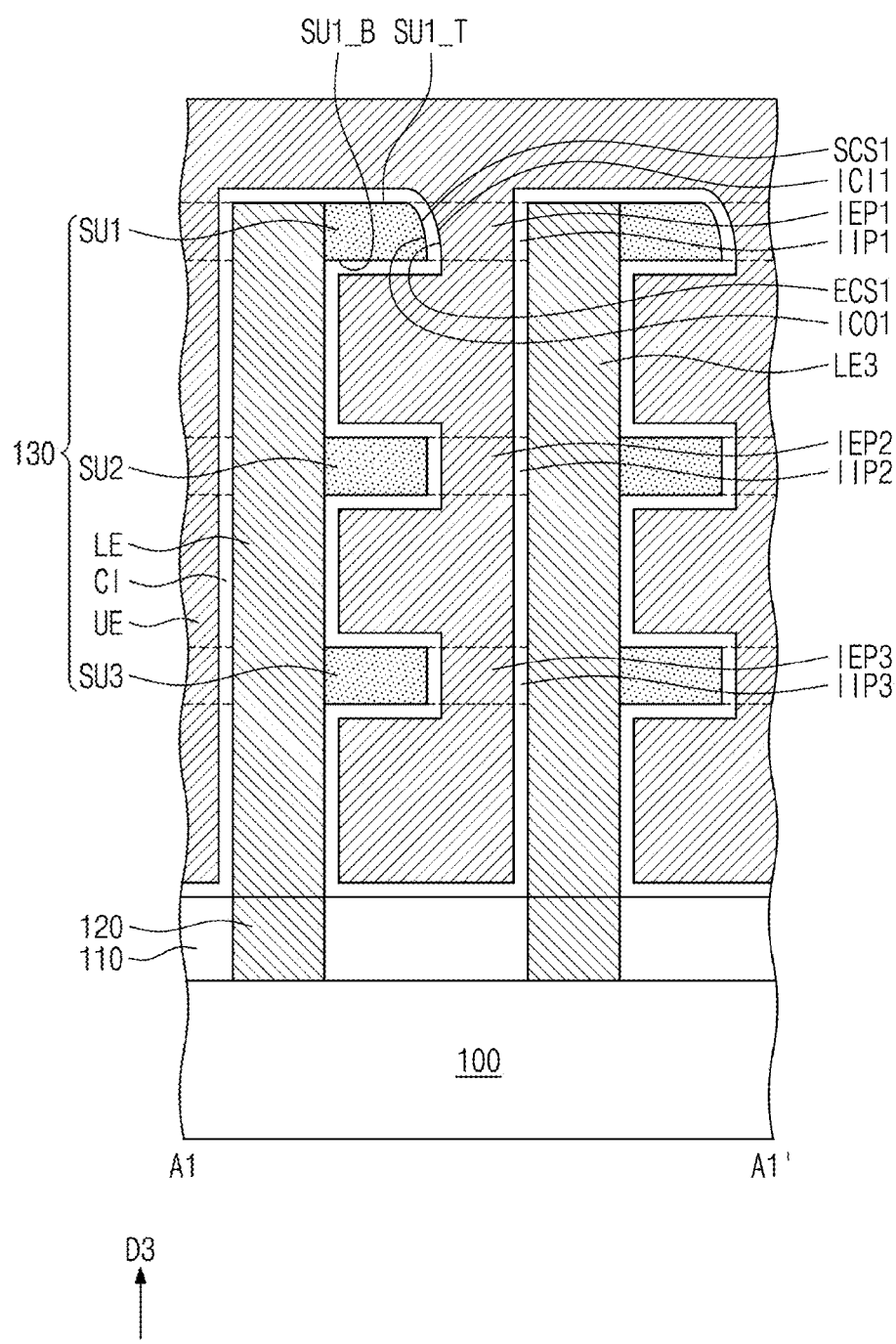
FIG. 1B is a sectional view taken along a line A1-A1' of FIG. 1A.
Figure 1C:
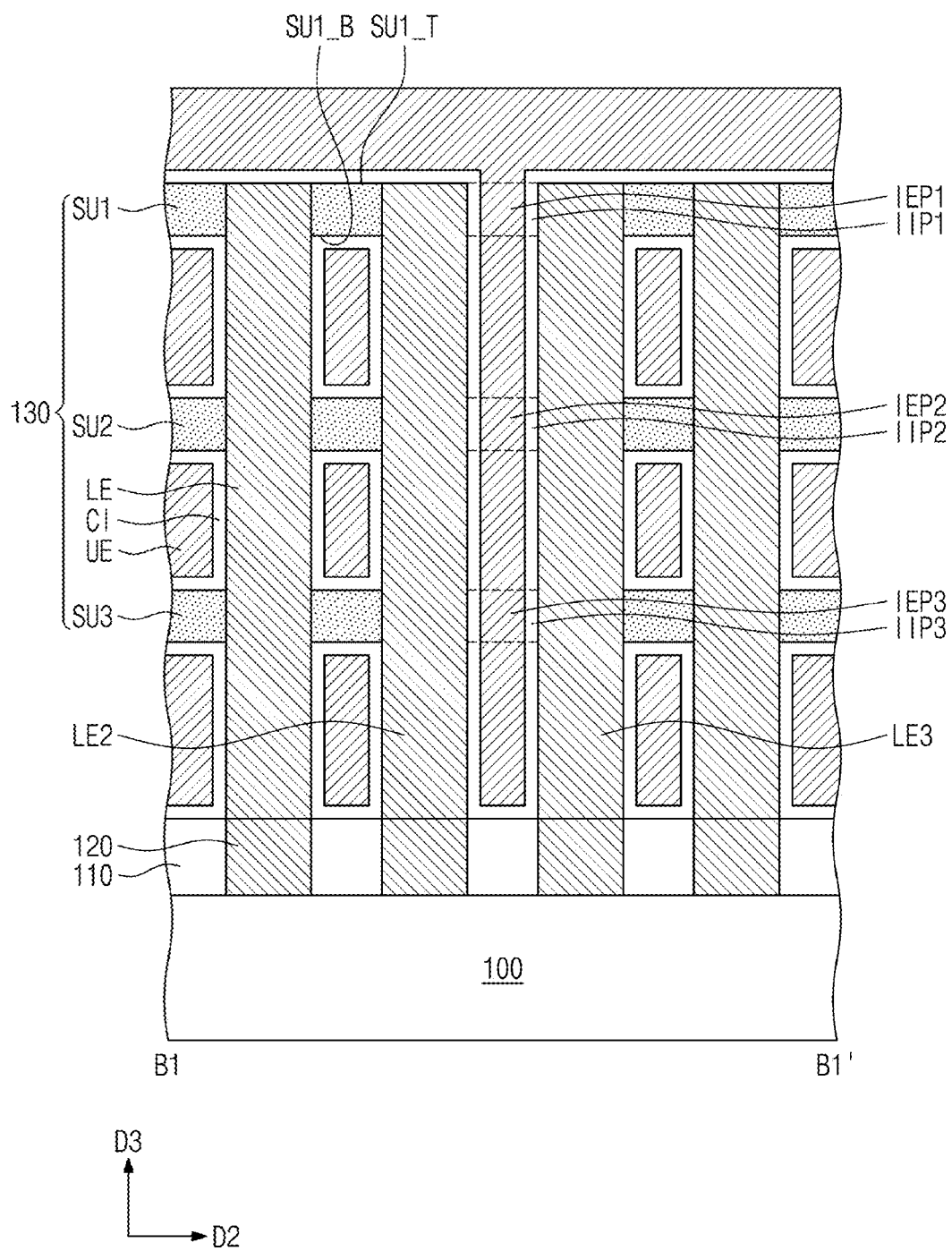
FIG. 1C is a sectional view taken along a line B1-B1' of FIG. 1A.
Figure 1D:
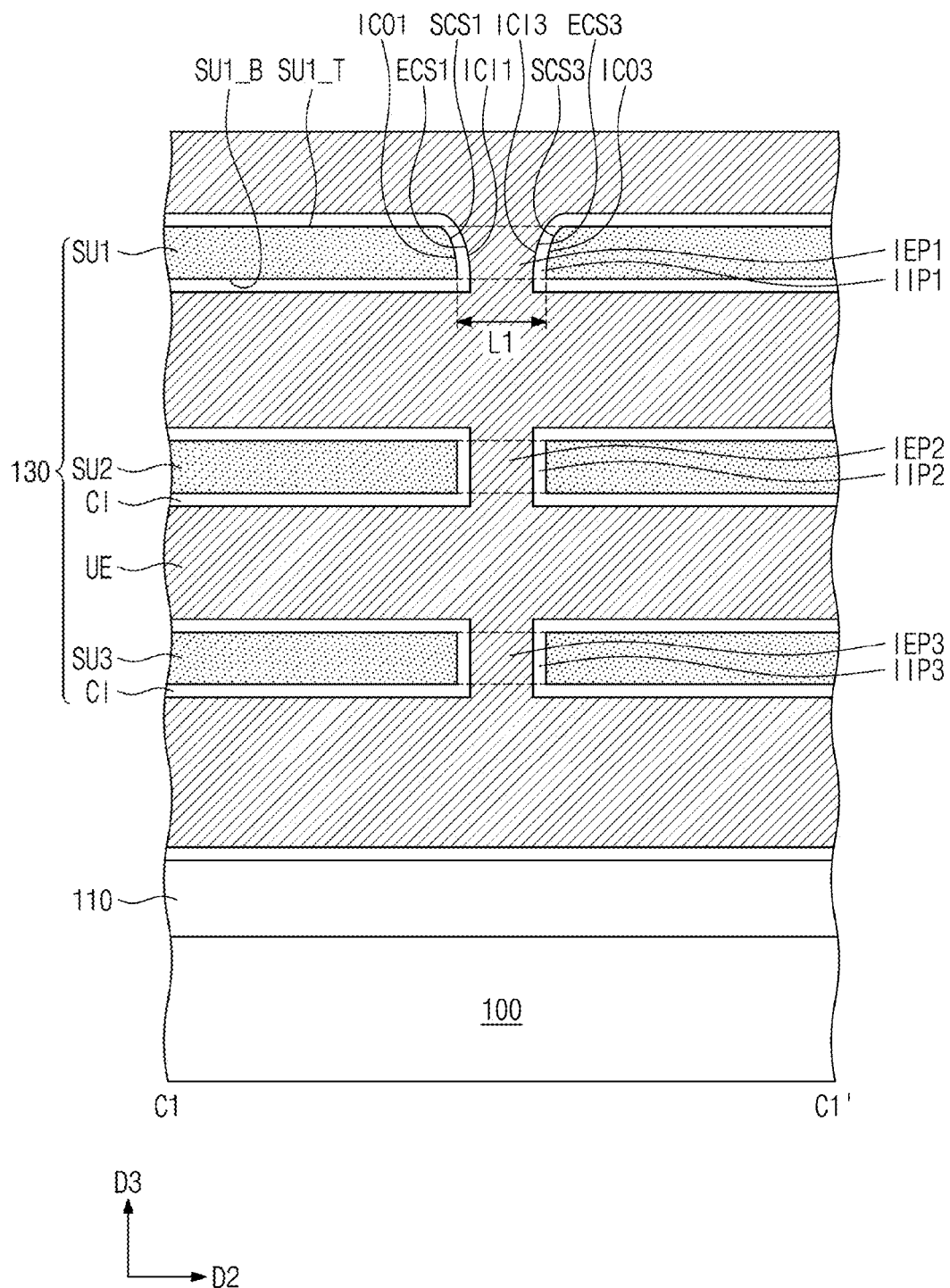
FIG. 1D is a sectional view taken along a line C1-C1' of FIG. 1A.
Figure 1E:
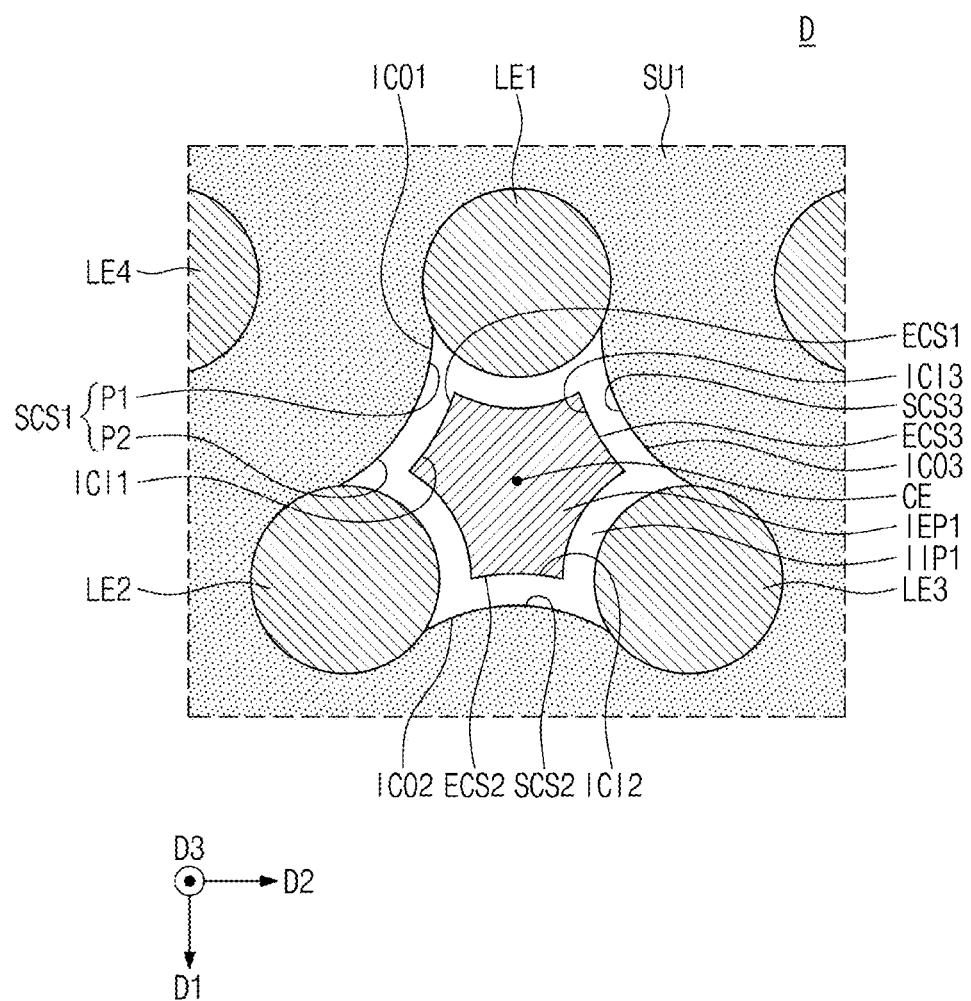
FIG. 1E is an enlarged plan view illustrating a portion 'D' of FIG. 1A.
Figure 1F:
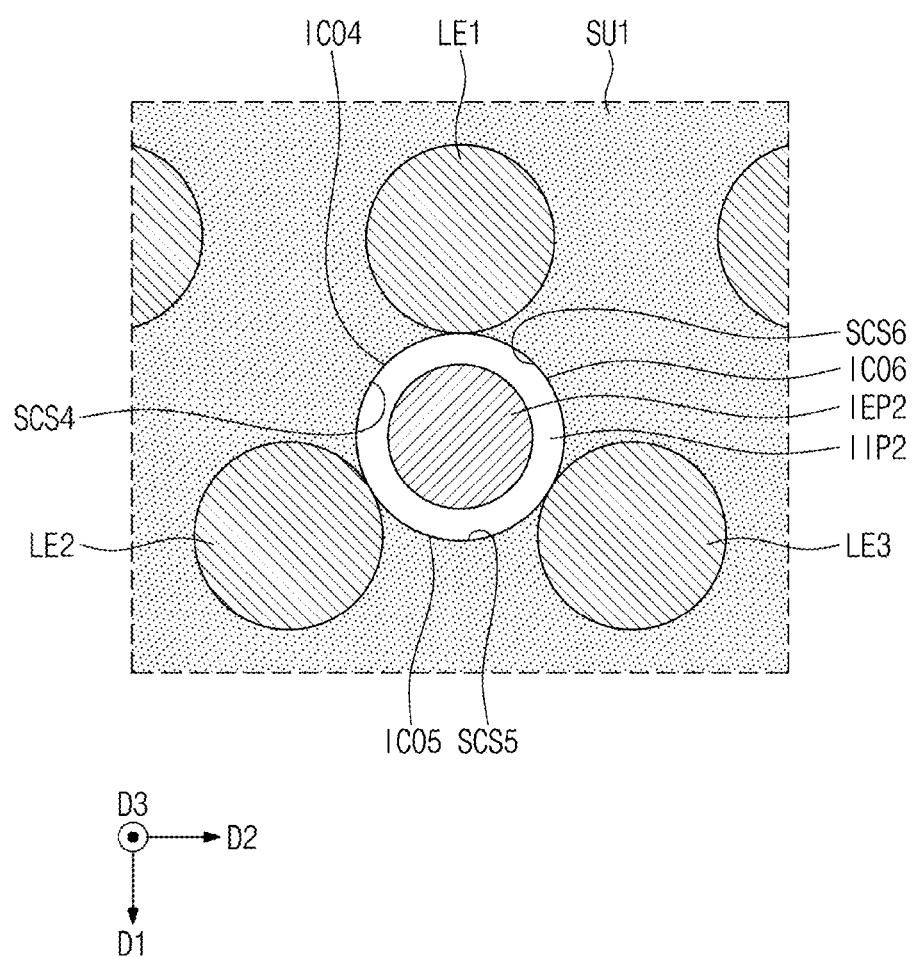
FIG. 1F is a diagram illustrating a second supporter of the semiconductor device of FIGS. 1A to 1E.

FIG. 1A is a plan view illustrating a semiconductor device according to an embodiment. FIG. 1B is a sectional view taken along a line A1-A1' of FIG. 1A. FIG. 1C is a sectional view taken along a line B1-B1' of FIG. 1A. FIG. 1D is a sectional view taken along a line C1-C1' of FIG. 1A. FIG. 1E is an enlarged plan view illustrating a portion 'D' of FIG. 1A. FIG. 1F is a diagram illustrating a second supporter of the semiconductor device of FIGS. 1A to 1E. FIG. 1E illustrates a first supporter of a semiconductor device. For example, FIG. 1E is a diagram illustrating a structure of a first supporter of a semiconductor device at a level of a top surface of the first supporter. FIG. 1F is a diagram illustrating a structure of a second supporter of the semiconductor device at a level of a top surface of the second supporter.

Referring to FIGS. 1A to 1F, the semiconductor device may include a substrate 100. In an embodiment, the substrate 100 may be a semiconductor substrate. As an example, the substrate 100 may be formed of or include silicon, germanium, silicon-germanium, GaP, or GaAs. In an embodiment, the substrate 100 may be a silicon-on-insulator (SOI) substrate or a germanium-on-insulator (GOI) substrate. The substrate 100 may have a shape of a plate that is extended in a first direction D1 and a second direction D2. The first and second directions D1 and D2 may not be parallel to each other. In an embodiment, the first and second directions D1 and D2 may be horizontal directions that are orthogonal to each other.

An interlayer insulating layer 110 may be provided to cover the substrate 100. The interlayer insulating layer 110 may be formed of or include at least one of insulating materials. In an embodiment, the interlayer insulating layer 110 may be a multi-layered insulating structure including a plurality of insulating layers.

Capacitor contact structures 120 may be provided in the interlayer insulating layer 110. The capacitor contact structure 120 may be formed of or include at least one of conductive materials. The capacitor contact structure 120 may be electrically connected to the substrate 100. In an embodiment, the substrate 100 may include an active pattern with an impurity region, and the capacitor contact structure 120 may be connected to the impurity region in the active pattern of the substrate 100. In an embodiment, the capacitor contact structure 120 may be a multi-layered conductive structure including a plurality of conductive layers.

A capacitor structure 130 may be provided on the interlayer insulating layer 110 and the capacitor contact structure 120. The capacitor structure 130 may be electrically connected to the capacitor contact structure 120. The capacitor structure 130 may be electrically connected to the substrate 100 through the capacitor contact structure 120. The capacitor structure 130 may include lower electrodes LE, a capacitor insulating layer CI, a first supporter SU1, a second supporter SU2, a third supporter SU3, and an upper electrode UE.

The lower electrode LE may have a shape of a circular pillar extending in a third direction D3. The third direction D3 might not be parallel to the first and second directions D1 and D2. As an example, the third direction D3 may be a vertical direction, which is orthogonal to the first and second directions D1 and D2. The lower electrode LE may be connected to the capacitor contact structure 120.

The capacitor insulating layer CI may cover the lower electrodes LE and the first to third supporters SU1, SU2, and SU3. The capacitor insulating layer CI may be provided to enclose the lower electrodes LE and the first to third supporters SU1, SU2, and SU3. The capacitor insulating layer CI may cover the interlayer insulating layer 110. The capacitor insulating layer CI may be formed of or include an insulating material. As an example, the capacitor insulating layer CI may be formed of or include an oxide. In an embodiment, the capacitor insulating layer CI may be a multi-layered insulating layer.

The upper electrode UE may be provided on the capacitor insulating layer CI. The upper electrode UE may cover the capacitor insulating layer CI. The upper electrode UE may be provided to enclose the lower electrodes LE, the first to third supporters SU1, SU2, and SU3, and the capacitor insulating layer CI.

The first to third supporters SU1, SU2, and SU3 may support the lower electrodes LE. The first to third supporters SU1, SU2, and SU3 may be provided to enclose the lower electrodes LE. The first to third supporters SU1, SU2, and SU3 may be formed of or include at least one of insulating materials. As an example, the first to third supporters SU1, SU2, and SU3 may be formed of or include silicon carbon nitride (e.g., SiCN). The first supporter SU1 may be disposed at the highest level, among the supporters SU1, SU2, and SU3. The second supporter SU2 may be disposed at a level lower than the first supporter SU1. The second supporter SU2 may be disposed below the first supporter SU1. The third supporter SU3 may be disposed at a level lower than the second supporter SU2. The third supporter SU3 may be disposed below the second supporter SU2.

The lower electrodes LE may be formed of or include at least one of conductive materials. As an example, the lower electrodes LE may be formed of or include TiSiN. The upper electrode UE may be formed of or include at least one of conductive materials. As an example, the upper electrode UE may be formed of or include TiN.

The upper electrode UE may include first intervening electrode portions IEP1, which are located at the same level as the first supporter SU1. The first intervening electrode portion IEP1 may be a portion of the upper electrode UE, which is enclosed by the first supporter SU1. The first intervening electrode portion IEP1 may be a portion of the upper electrode UE, which is disposed between a top surface SU1_T and a bottom surface SU1_B of the first supporter SU1. The first supporter SU1 may include supporter curved sidewalls SCS. The supporter curved sidewall SCS of the first supporter SU1 may be a sidewall facing the first intervening electrode portion IEP1 of the upper electrode UE. The top surface SU1_T of the first supporter SU1 may be disposed at the same level as the top surface of the lower electrode LE. The top surface SU1_T of the first supporter SU1 may be coplanar with the top surface of the lower electrode LE.

The supporter curved sidewalls SCS of the first supporter SU1 and the lower electrodes LE, which are connected to each other, may be provided to enclose the first intervening electrode portion IEP1 of the upper electrode UE. For example, the lower electrodes LE may include a first lower electrode LE1, a second lower electrode LE2, and a third lower electrode LE3, which are disposed to be adjacent to each other, the first supporter SU1 may include a first supporter curved sidewall SCS1, a second supporter curved sidewall SCS2, and a third supporter curved sidewall SCS3, which are adjacent to each other, and the first intervening electrode portion IEP1 of the upper electrode UE may be surrounded by the first to third lower electrodes LE1, LE2, and LE3 and the first to third supporter curved sidewalls SCS1, SCS2, and SCS3. The first intervening electrode portion IEP1 of the upper electrode UE may be disposed in a space defined by the first to third lower electrodes LE1, LE2, and LE3 and the first to third supporter curved sidewalls SCS1, SCS2, and SCS3.

The first supporter curved sidewall SCS1 may be connected to the first lower electrode LE1 and the second lower electrode LE2. The second supporter curved sidewall SCS2 may be connected to the second lower electrode LE2 and the third lower electrode LE3. The third supporter curved sidewall SCS3 may be connected to the first lower electrode LE1 and the third lower electrode LE3.

The first intervening electrode portion IEP1 of the upper electrode UE may be disposed between the first and second supporter curved sidewalls SCS1 and SCS2. The first intervening electrode portion IEP1 of the upper electrode UE may be disposed between the second and third supporter curved sidewalls SCS2 and SCS3. The first intervening electrode portion IEP1 of the upper electrode UE may be disposed between the first and third supporter curved sidewalls SCS1 and SCS3. The first intervening electrode portion IEP1 of the upper electrode UE may be disposed between the first and second lower electrodes LE1 and LE2. The first intervening electrode portion IEP1 of the upper electrode UE may be disposed between the second and third lower electrodes LE2 and LE3. The first intervening electrode portion IEP1 of the upper electrode UE may be disposed between the first and third lower electrodes LE1 and LE3.

Each of the first to third supporter curved sidewalls SCS1, SCS2, and SCS3 may have a curved shape. The first to third supporter curved sidewalls SCS1, SCS2, and SCS3 may be convex toward the first intervening electrode portion IEP1 of the upper electrode UE. As an example, when viewed in the plan view of FIG. 1E, the first to third supporter curved sidewalls SCS1, SCS2, and SCS3 may be convex toward the first intervening electrode portion IEP1 of the upper electrode UE.

A distance between the first and third supporter curved sidewalls SCS1 and SCS3 may decrease as a vertical level decreases. As an example, a distance L1 (e.g., see FIG. 1D) between the first and third supporter curved sidewalls SCS1 and SCS3 in the second direction D2 may decrease as a vertical level decreases. A distance between the first and second supporter curved sidewalls SCS1 and SCS2 may decrease as a vertical level decreases. A distance between the second and third supporter curved sidewalls SCS2 and SCS3 may decrease as a vertical level decreases.

A distance from a portion of the supporter curved sidewall SCS of the first supporter SU1, which is adjacent to the lower electrode LE, to a center CE of the first intervening electrode portion IEP1 may decrease as a distance from the lower electrode LE increases. For example, the first supporter curved sidewall SCS1 may include a portion P1 adjacent to the first lower electrode LE1 and a portion P2 adjacent to the second lower electrode LE2, and here, a distance between the portion P1 of the first supporter curved sidewall SCS1, which is adjacent to the first lower electrode LE1, and the center CE of the first intervening electrode portion IEP1 may decrease as a distance from the first lower electrode LE1 increases, and a distance between the portion P2 of the first supporter curved sidewall SCS1, which is adjacent to the second lower electrode LE2, and the center CE of the first intervening electrode portion IEP1, may decrease as a distance from the second lower electrode LE2 increases.

The capacitor insulating layer CI may include a first intervening insulating portion IIP1 enclosing the first intervening electrode portion IEP1. The first intervening insulating portion IIP1 may be a portion of the capacitor insulating layer CI, which is disposed at the same level as the first supporter SU1 and the first intervening electrode portion IEP1. The first intervening insulating portion IIP1 may be a portion of the capacitor insulating layer CI, which is disposed between the top surface SU1_T and the bottom surface SU1_B of the first supporter SU1. The first intervening insulating portion IIP1 may be surrounded by the first to third lower electrodes LE1, LE2, and LE3 and the first to third supporter curved sidewalls SCS1, SCS2, and SCS3. The first intervening insulating portion IIP1 may be provided between the first to third lower electrodes LE1, LE2, and LE3 and the first intervening electrode portion IEP1 and between the first to third supporter curved sidewalls SCS1, SCS2, and SCS3 and the first intervening electrode portion IEP1.

The first intervening insulating portion IIP1 may include a first insulating curved outer sidewall ICO1 in contact with the first supporter curved sidewall SCS1, a second insulating curved outer sidewall ICO2 in contact with the second supporter curved sidewall SCS2, and a third insulating curved outer sidewall ICO3 in contact with the third supporter curved sidewall SCS3. The first insulating curved outer sidewall ICO1 may have a curved shape corresponding to the first supporter curved sidewall SCS1. The second insulating curved outer sidewall ICO2 may have a curved shape corresponding to the second supporter curved sidewall SCS2. The third insulating curved outer sidewall ICO3 may have a curved shape corresponding to the third supporter curved sidewall SCS3. The first to third insulating curved outer sidewalls ICO1, ICO2, and ICO3 may be concave toward the first intervening electrode portion IEP1. The first insulating curved outer sidewall ICO1 may be connected to the first and second lower electrodes LE1 and LE2. The second insulating curved outer sidewall ICO2 may be connected to the second and third lower electrodes LE2 and LE3. The third insulating curved outer sidewall ICO3 may be connected to the first and third lower electrodes LE1 and LE3.

A distance between the first and second insulating curved outer sidewalls ICO1 and ICO2 may decrease as a vertical level decreases. A distance between the second and third insulating curved outer sidewalls ICO2 and ICO3 may decrease as a vertical level decreases. A distance between the first and third insulating curved outer sidewalls ICO1 and ICO3 may decrease as a vertical level decreases.

The first intervening insulating portion IIP1 may include a first insulating curved inner sidewall ICI1, which is opposite to the first insulating curved outer sidewall ICO1, a second insulating curved inner sidewall ICI2, which is opposite to the second insulating curved outer sidewall ICO2, and a third insulating curved inner sidewall ICI3, which is opposite to the third insulating curved outer sidewall ICO3. The first to third insulating curved inner sidewalls ICI1, ICI2, and ICI3 may be convex toward the first intervening electrode portion IEP1. A distance between the first and second insulating curved inner sidewalls ICI1 and ICI2 may decrease as a vertical level decreases. A distance between the second and third insulating curved inner sidewalls ICI2 and ICI3 may decrease as a vertical level decreases. A distance between the first and third insulating curved inner sidewalls ICI1 and ICI3 may decrease as a vertical level decreases.

The first intervening electrode portion IEP1 may include a first electrode curved sidewall ECS1 in contact with the first insulating curved inner sidewall ICI1, a second electrode curved sidewall ECS2 in contact with the second insulating curved inner sidewall ICI2, and a third electrode curved sidewall ECS3 in contact with the third insulating curved inner sidewall ICI3. The first electrode curved sidewall ECS1 may face the first supporter curved sidewall SCS1. The second electrode curved sidewall ECS2 may face the second supporter curved sidewall SCS2. The third electrode curved sidewall ECS3 may face the third supporter curved sidewall SCS3.

The first electrode curved sidewall ECS1 may have a curved shape corresponding to the first insulating curved inner sidewall ICI1. The second electrode curved sidewall ECS2 may have a curved shape corresponding to the second insulating curved inner sidewall ICI2. The third electrode curved sidewall ECS3 may have a curved shape corresponding to the third insulating curved inner sidewall ICI3. The first to third electrode curved sidewalls ECS1, ECS2, and ECS3 may be concave toward the center CE of the first intervening electrode portion IEP1.

A distance between the first and second electrode curved sidewalls ECS1 and ECS2 may decrease as a vertical level decreases. A distance between the second and third electrode curved sidewalls ECS2 and ECS3 may decrease as a vertical level decreases. A distance between the first and third electrode curved sidewalls ECS1 and ECS3 may decrease as a vertical level decreases. A width of the first intervening electrode portion IEP1 may decrease as a vertical level decreases.

A distance between the first supporter curved sidewall SCS1 and the third lower electrode LE3 may decrease as a vertical level decreases. A distance between the second supporter curved sidewall SCS2 and the first lower electrode LE1 may decrease as a vertical level decreases. A distance between the third supporter curved sidewall SCS3 and the second lower electrode LE2 may decrease as a vertical level decreases.

The upper electrode UE may include second intervening electrode portions IEP2, which are disposed at the same level as the second supporter SU2. The second intervening electrode portion IEP2 may be a portion of the upper electrode UE enclosed by the second supporter SU2. In an embodiment, the second supporter SU2 may include a fourth supporter curved sidewall SCS4, a fifth supporter curved sidewall SCS5, and a sixth supporter curved sidewall SCS6, which are adjacent to each other, and the second intervening electrode portion IEP2 of the upper electrode UE may be surrounded by the first to third lower electrodes LE1, LE2, and LE3 and the fourth to sixth supporter curved sidewalls SCS4, SCS5, and SCS6. The second intervening electrode portion IEP2 of the upper electrode UE may be disposed in a space that is defined by the first to third lower electrodes LE1, LE2, and LE3 and the fourth to sixth supporter curved sidewalls SCS4, SCS5, and SCS6.

The fourth supporter curved sidewall SCS4 may be connected to the first lower electrode LE1 and the second lower electrode LE2. The fifth supporter curved sidewall SCS5 may be connected to the second lower electrode LE2 and the third lower electrode LE3. The sixth supporter curved sidewall SCS6 may be connected to the first lower electrode LE1 and the third lower electrode LE3.

The second intervening electrode portion IEP2 of the upper electrode UE may be disposed between the fourth and fifth supporter curved sidewalls SCS4 and SCS5. The second intervening electrode portion IEP2 of the upper electrode UE may be disposed between the fifth and sixth supporter curved sidewalls SCS5 and SCS6. The second intervening electrode portion IEP2 of the upper electrode UE may be disposed between the fourth and sixth supporter curved sidewalls SCS4 and SCS6. The second intervening electrode portion IEP2 of the upper electrode UE may be disposed between the first and second lower electrodes LE1 and LE2. The second intervening electrode portion IEP2 of the upper electrode UE may be disposed between the second and third lower electrodes LE2 and LE3. The second intervening electrode portion IEP2 of the upper electrode UE may be disposed between the first and third lower electrodes LE1 and LE3.

The fourth to sixth supporter curved sidewalls SCS4, SCS5, and SCS6 may have a curved shape. The fourth to sixth supporter curved sidewalls SCS4, SCS5, and SCS6 may be concave. As an example, when viewed in the plan view of FIG. 1F, each of the fourth to sixth supporter curved sidewalls SCS4, SCS5, and SCS6 may be provided to have a concave shape.

The capacitor insulating layer CI may include a second intervening insulating portion IIP2 enclosing the second intervening electrode portion IEP2. The second intervening insulating portion IIP2 may be a portion of the capacitor insulating layer CI, which is disposed at the same level as the second supporter SU2 and the second intervening electrode portion IEP2. The second intervening insulating portion IIP2 may be surrounded by the first to third lower electrodes LE1, LE2, and LE3 and the fourth to sixth supporter curved sidewalls SCS4, SCS5, and SCS6. The second intervening insulating portion IIP2 may be provided between the first to third lower electrodes LE1, LE2, and LE3 and the second intervening electrode portion IEP2 and between the fourth to sixth supporter curved sidewalls SCS4, SCS5, and SCS6 and the second intervening electrode portion IEP2.

The second intervening insulating portion IIP2 may include a fourth insulating curved outer sidewall ICO4 in contact with the fourth supporter curved sidewall SCS4, a fifth insulating curved outer sidewall ICO5 in contact with the fifth supporter curved sidewall SCS5, and a sixth insulating curved outer sidewall ICO6 in contact with the sixth supporter curved sidewall SCS6. The fourth to sixth insulating curved outer sidewalls ICO4, ICO5, and ICO6 may be convex. The fourth insulating curved outer sidewall ICO4 may be connected to the first and second lower electrodes LE1 and LE2. The fifth insulating curved outer sidewall ICO5 may be connected to the second and third lower electrodes LE2 and LE3. The sixth insulating curved outer sidewall ICO6 may be connected to the first and third lower electrodes LE1 and LE3.

In an embodiment, the second intervening insulating portion IIP2 may have a ring shape, when viewed in a plan view, and the second intervening electrode portion IEP2 may have a circular shape, when viewed in a plan view. A planar area of the second intervening electrode portion IEP2 may be smaller than a planar area of the first intervening electrode portion IEP1.

In an embodiment, the supporter curved sidewalls SCS of the second supporter SU2 may have a similar shape to the supporter curved sidewalls SCS of the first supporter SU1, the second intervening insulating portion IIP2 may have a similar shape to the first intervening insulating portion IIP1, and the second intervening electrode portion IEP2 may have a similar shape to the first intervening electrode portion IEP1. The upper electrode UE may include a third intervening electrode portion IEP3 enclosed by the third supporter SU3. The capacitor insulating layer CI may include a third intervening insulating portion IIP3 enclosing the third intervening electrode portion IEP3. The third intervening electrode portion IEP3 may have a shape similar to the second intervening electrode portion IEP2. A shape of the third intervening insulating portion IIP3 may be similar to a shape of the second intervening insulating portion IIP2.

In an embodiment, the supporter curved sidewalls SCS of the third supporter SU3 may have a shape similar to the supporter curved sidewalls SCS of the first supporter SU1, the third intervening insulating portion IIP3 may have a shape similar to the first intervening insulating portion IIP1, and the third intervening electrode portion IEP3 may have a shape similar to the first intervening electrode portion IEP1.

According to an embodiment, since the first supporter curved sidewall SCS1 of the semiconductor device is convex toward the first intervening electrode portion IEP1, a distance from a fourth lower electrode LE4, which is adjacent to the first and second lower electrodes LE1 and LE2, to the first supporter curved sidewall SCS1 may have a relatively large value. In this case, a misalignment margin between the fourth lower electrode LE4 and the first supporter curved sidewall SCS1 may be increased, and thus, it may be possible to prevent the fourth lower electrode LE4 from being connected to the first supporter curved sidewall SCS1.

In a semiconductor device according to an embodiment, since the first supporter curved sidewall SCS1 is convex toward the first intervening electrode portion IEP1, a distance between the first and second lower electrodes LE1 and LE2, which is measured along a surface of the first supporter curved sidewall SCS1, may have a relatively large value. Accordingly, it may be possible to prevent or suppress a bridge disturbance issue from occurring between the first and second lower electrodes LE1 and LE2.

Figure 2A:
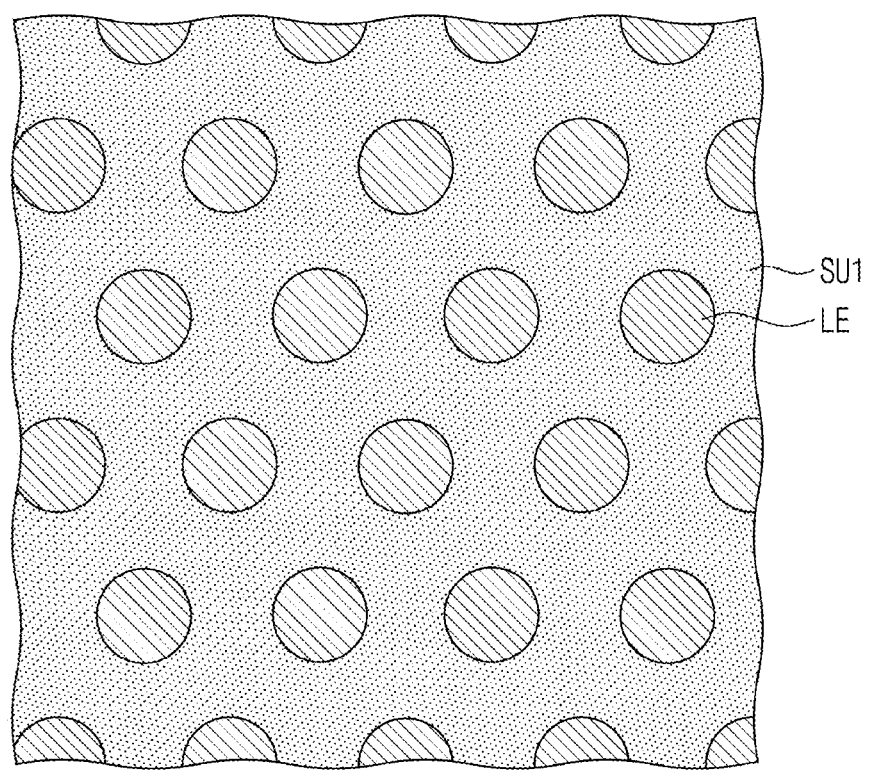
FIGS. 2A, 2B, 3A, 3B, 4A, 4B, 4C, and 4D are diagrams illustrating a method of fabricating the semiconductor device of FIG. 1A to 1F.
Figure 2A:
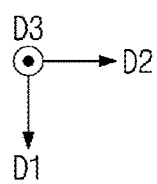
Figure 2B:
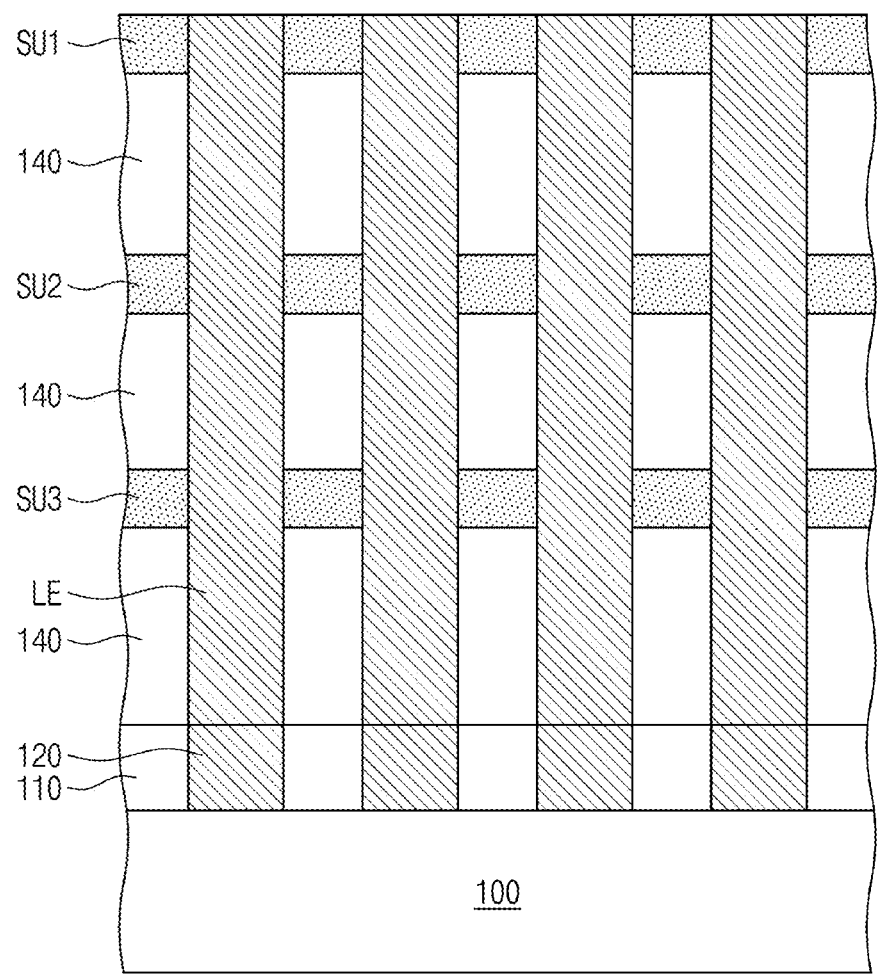
Figure 3A:
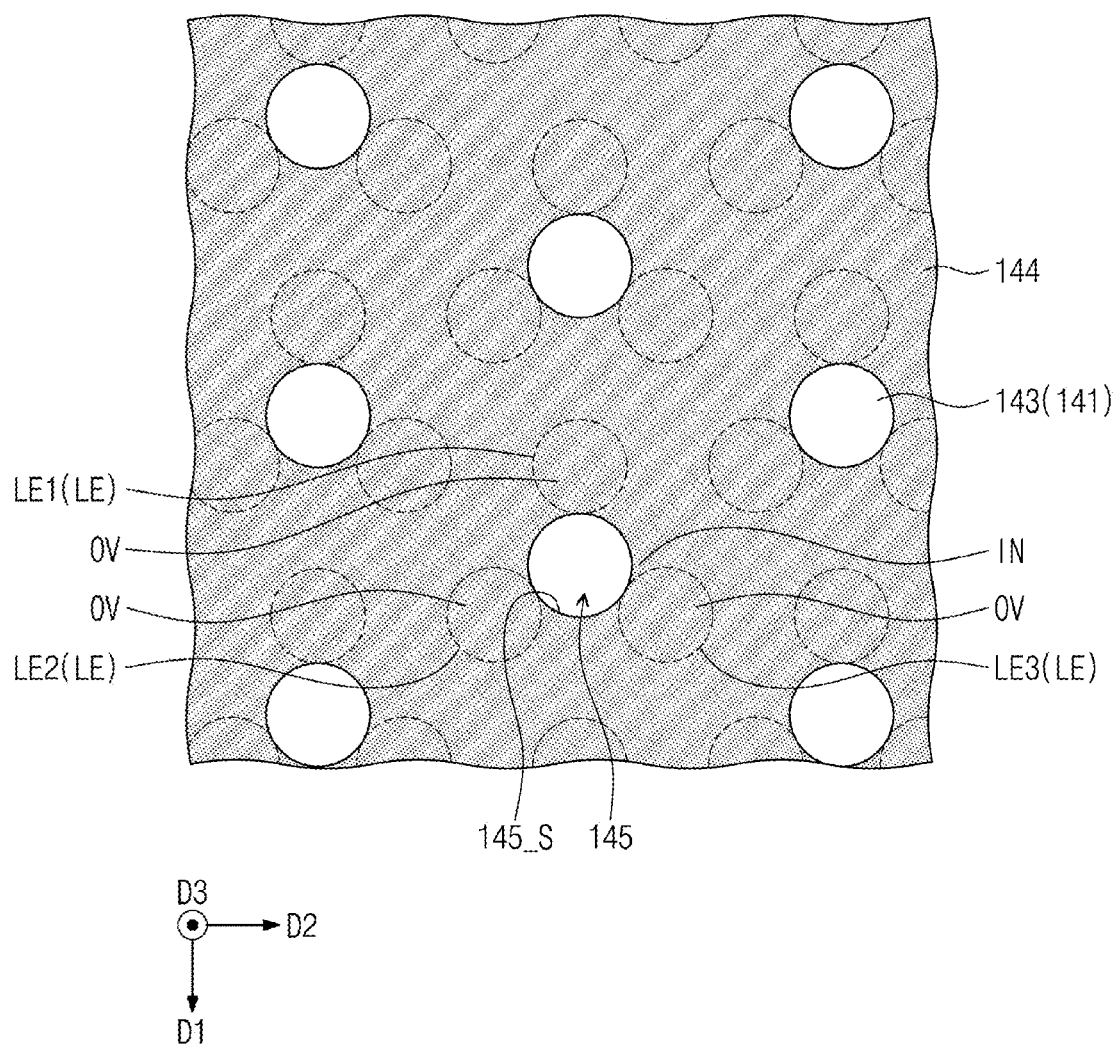
Figure 3B:
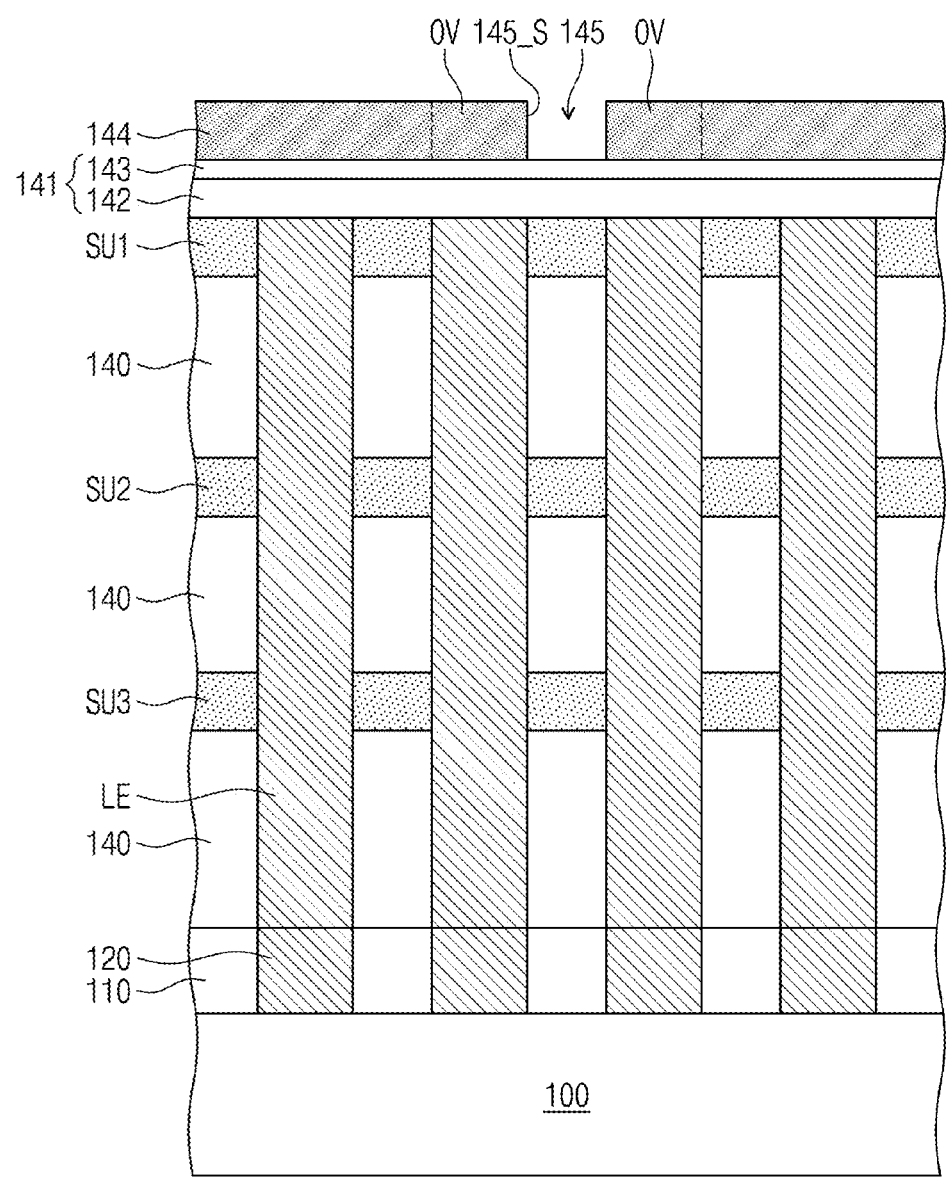
Figure 4A:
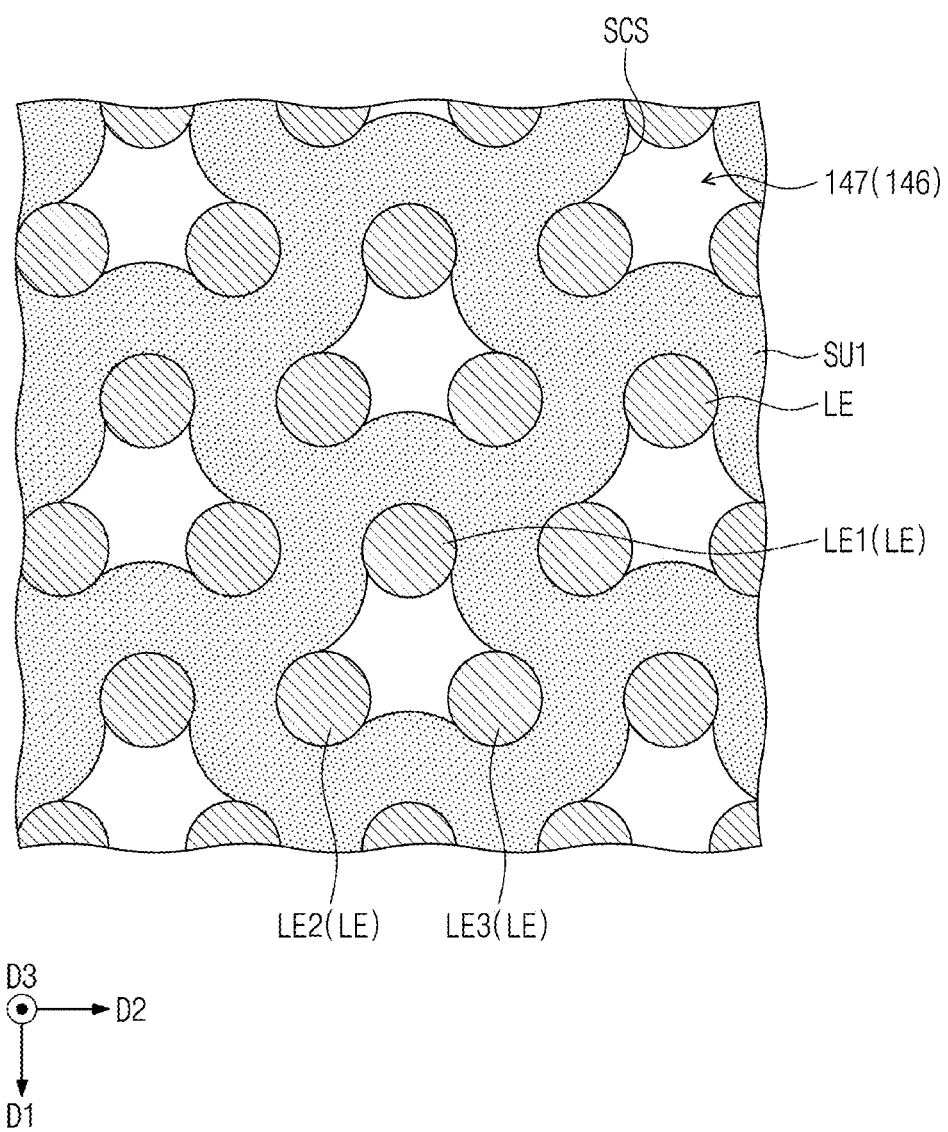
Figure 4B:
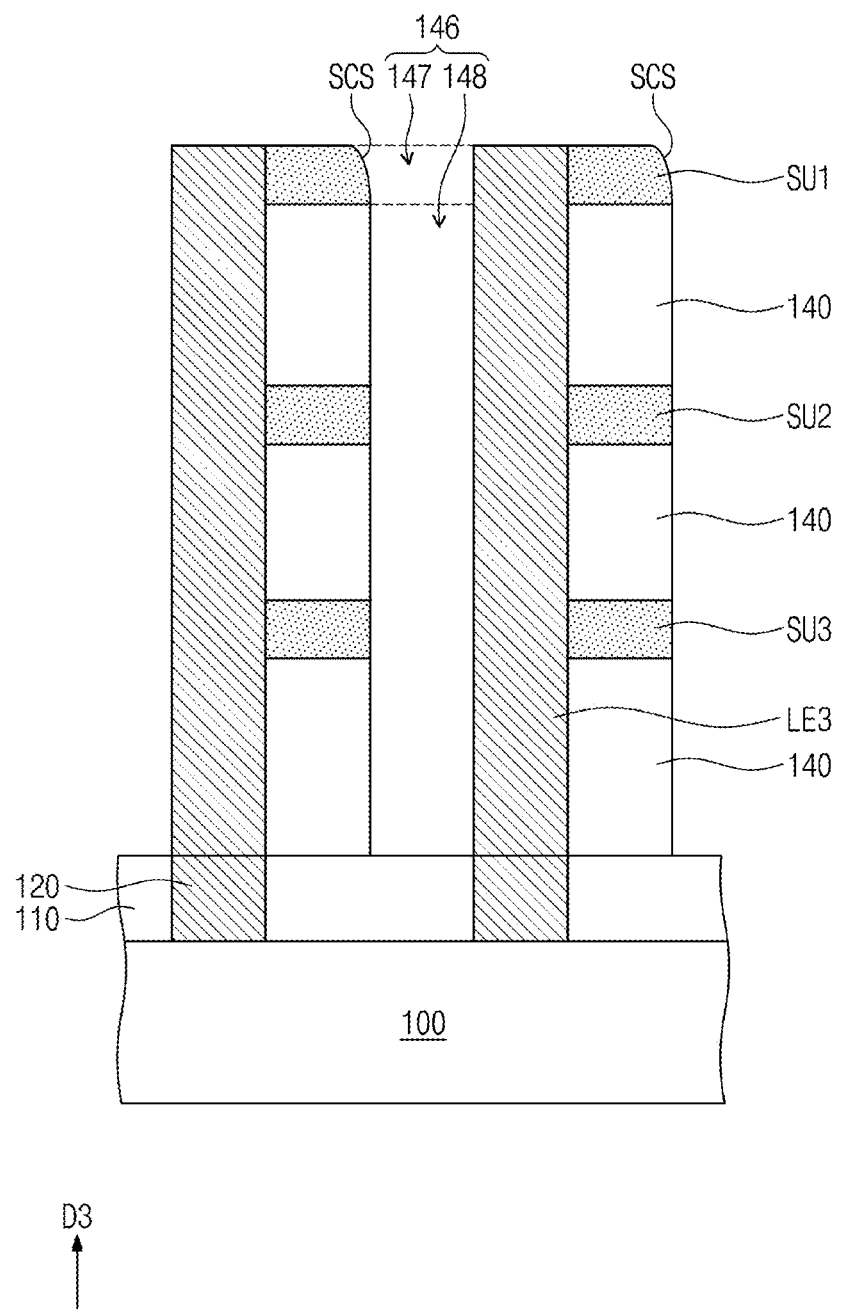
Figure 4C:
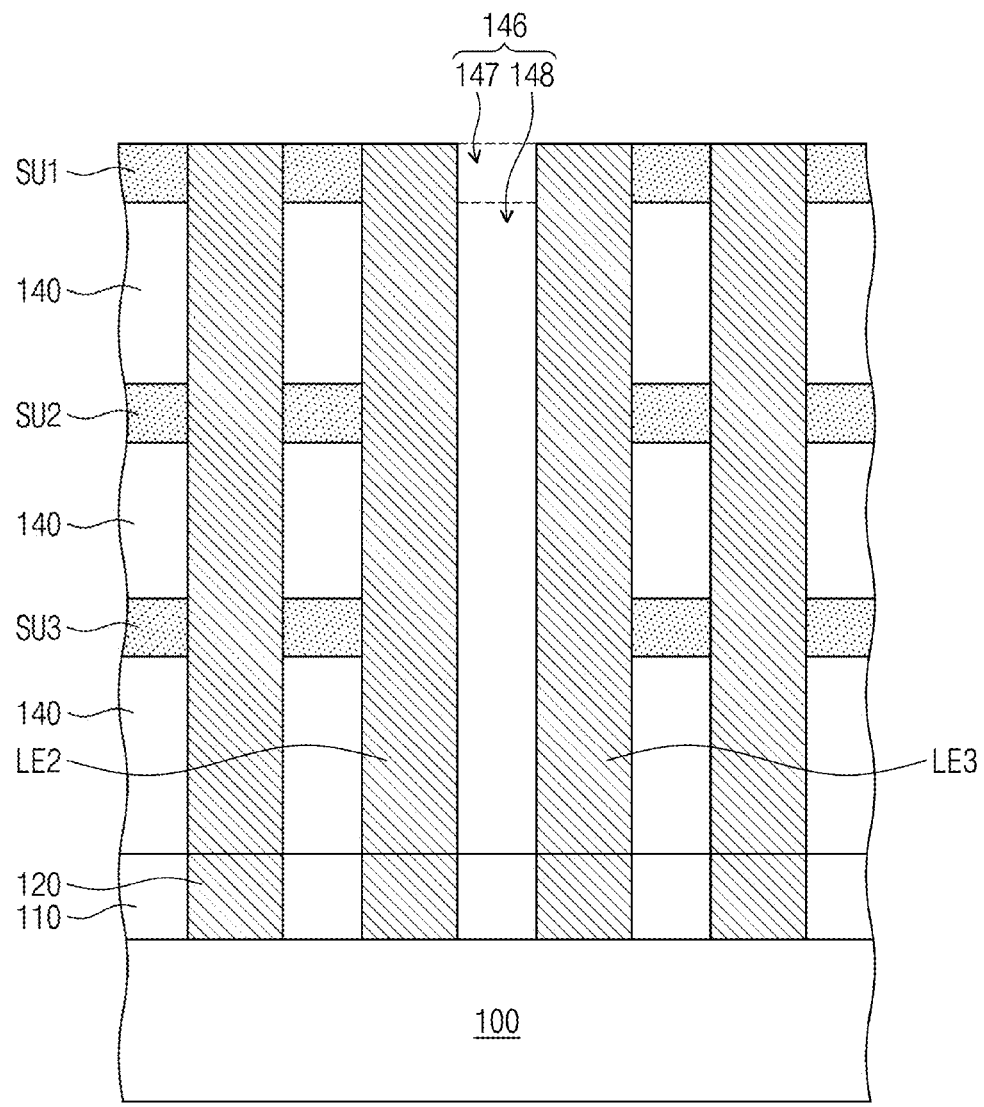
Figure 4D:
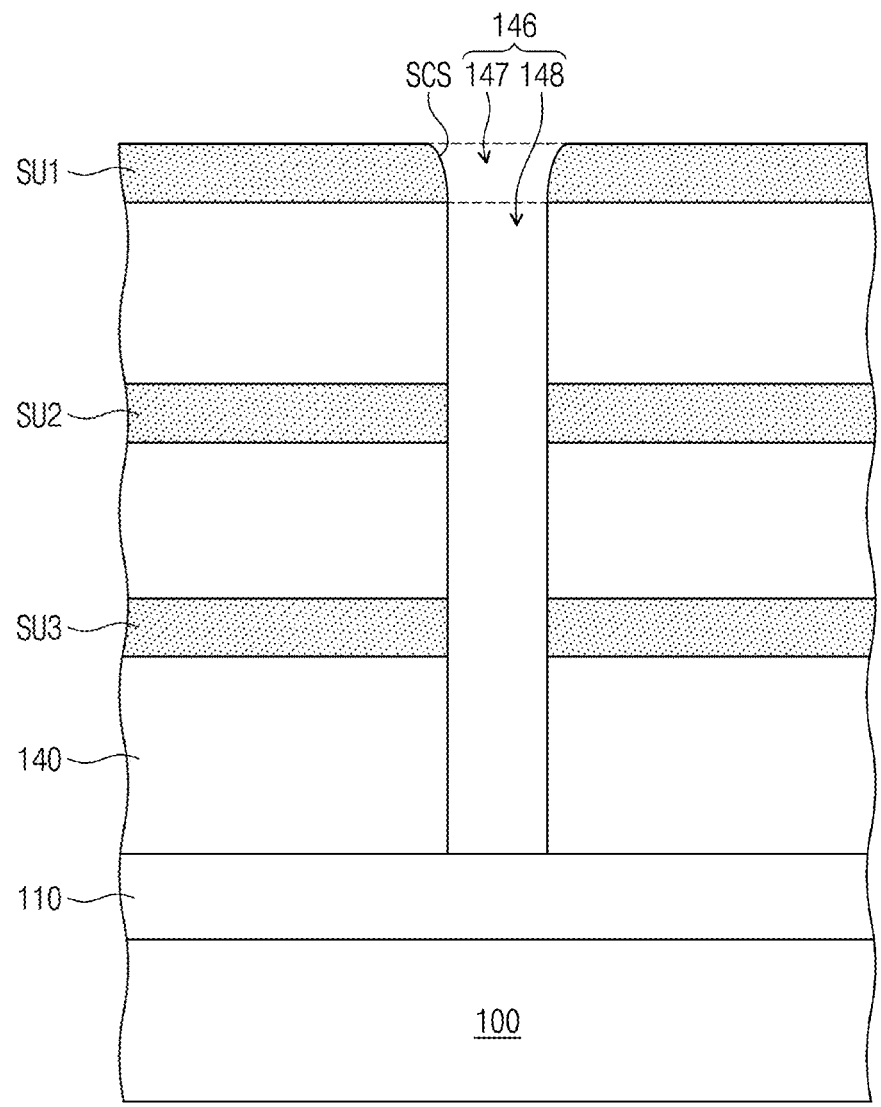

FIGS. 2A, 2B, 3A, 3B, 4A, 4B, 4C, and 4D are diagrams illustrating a method of fabricating the semiconductor device of FIG. 1A to 1F. FIGS. 2A, 3A, and 4A may correspond to FIG. 1A. FIGS. 2B, 3B, and 4C may correspond to FIG. 1C. FIG. 4B may correspond to FIG. 1B. FIG. 4D may correspond to FIG. 1D.

Referring to FIGS. 2A and 2B, the interlayer insulating layer 110 and the capacitor contact structure 120 may be formed on the substrate 100. Sacrificial layers 140 and the first to third supporters SU1, SU2, and SU3 may be alternately formed on the interlayer insulating layer 110 and the capacitor contact structure 120. The sacrificial layers 140 and the first to third supporters SU1, SU2, and SU3 may be formed of or include different insulating materials from each other. The insulating material of the sacrificial layers 140 may have an etch selectivity with respect to the insulating material of the first to third supporters SU1, SU2, and SU3. For example, the sacrificial layers 140 may be formed of or include oxide, and the first to third supporters SU1, SU2, and SU3 may be formed of or include silicon carbon nitride (e.g., SiCN).

The sacrificial layers 140 and the first to third supporters SU1, SU2, and SU3 may be patterned to form empty spaces in a shape of a circular pillar. The lower electrodes LE may be formed in the empty spaces. The lower electrodes LE may be formed to penetrate the sacrificial layers 140 and the first to third supporters SU1, SU2, and SU3.

Referring to FIGS. 3A and 3B, a mask structure 141 may be formed on the lower electrodes LE and the first supporter SU1. The mask structure 141 may include a first mask layer 142 on the lower electrodes LE and the first supporter SU1 and a second mask layer 143 on the first mask layer 142. In an embodiment, the first mask layer 142 may include an amorphous carbon layer, and the second mask layer 143 may be formed of or include silicon oxynitride (SiON). In an embodiment, the number of the mask layers that are included in the mask structure 141 may not be limited to two.

A photoresist pattern 144 may be formed on the mask structure 141. The formation of the photoresist pattern 144 may include forming a photoresist layer on the mask structure 141 and patterning the photoresist layer. The photoresist pattern 144 may be formed on the lower electrodes LE.

The photoresist pattern 144 may include openings 145. The openings 145 may be formed to penetrate the photoresist pattern 144. The second mask layer 143 of the mask structure 141 may be exposed through the openings 145.

In an embodiment, a sidewall 145_S of the opening 145 may overlap with the sidewall of the lower electrode LE in the third direction D3. For example, the sidewall 145_S of the opening 145 may overlap with the sidewalls of the first to third lower electrodes LE1, LE2, and LE3, which are adjacent to each other in the third direction D3.

The photoresist pattern 144 may include an overlapped portion OV, which overlaps the lower electrode LE in the third direction D3. For example, the overlapped portion OV may be a portion of the photoresist pattern 144 that is placed above the lower electrode LE in a vertical direction. The overlapped portion OV and the lower electrode LE may fully overlap with each other in the third direction D3. The entire portion of the overlapped portion OV may overlap the entire portion of the lower electrode LE in the third direction D3. When viewed in a plan view, the overlapped portion OV may have the same shape of the lower electrode LE. The overlapped portion OV may have a circular shape, when viewed in a plan view. The overlapped portion OV may be formed to have a shape of a circular pillar. The opening 145 may be disposed between three adjacent ones of the overlapped portions OV. The opening 145 may be surrounded by three adjacent ones of the overlapped portions OV. The opening 145 may be in contact with three adjacent ones of the overlapped portions OV.

The photoresist pattern 144 may include an intervening portion IN between the overlapped portion OV and the opening 145.

Referring to FIGS. 4A, 4B, 4C, and 4D, the mask structure 141 may be etched using the photoresist pattern 144 as an etch mask. Thereafter, the first supporter SU1, which is the uppermost one of the supporters SU1, SU2, and SU3, may be etched using the etched mask structure 141 as an etch mask. The first supporter SU1 and the lower electrode LE may include materials having a low etch selectivity with respect to each other, as described above. Thus, in the case where the first supporter SU1 is etched by an etching process having a low etch selectivity with respect to the lower electrode LE, the first supporter SU1 may be three-dimensionally etched to have the supporter curved sidewalls SCS.

Thereafter, the second supporter SU2, the third supporter SU3, and the sacrificial layers 140 may be etched to form a hole 146 between the lower electrodes LE. The hole 146 may be defined by the first supporter SU1, the second supporter SU2, the third supporter SU3, the sacrificial layers 140, the lower electrodes LE, and the interlayer insulating layer 110. The hole 146 may be enclosed by the first supporter SU1, the second supporter SU2, the third supporter SU3, the sacrificial layers 140, and the lower electrodes LE. The hole 146 may be connected to three adjacent ones of the lower electrodes LE. As an example, the hole 146 may be connected to the first to third lower electrodes LE1, LE2, and LE3.

The hole 146 may include a first portion 147 that is disposed at the same level as the first supporter SU1, and a second portion 148 below the first portion 147. The first portion 147 of the hole 146 may have a planar area larger than the opening 145 of the photoresist pattern 144. The second portion 148 of the hole 146 may have substantially the same planar area as the opening 145 of the photoresist pattern 144. The second portion 148 of the hole 146 may overlap the opening 145 of the photoresist pattern 144 in the third direction D3. The first portion 147 of the hole 146 may be defined by the supporter curved sidewall SCS of the first supporter SU1. The supporter curved sidewall SCS may be convex toward a center of the first portion 147 of the hole 146.

Referring to FIGS. 1A to 1F, the sacrificial layers 140 may be removed. The capacitor insulating layer CI may be formed. The first intervening insulating portion IIP1 of the capacitor insulating layer CI may be formed in the first portion 147 of the hole 146. The upper electrode UE may be formed. The first intervening electrode portion IEP1 of the upper electrode UE may be formed in the first portion 147 of the hole 146.

Figure 5A:
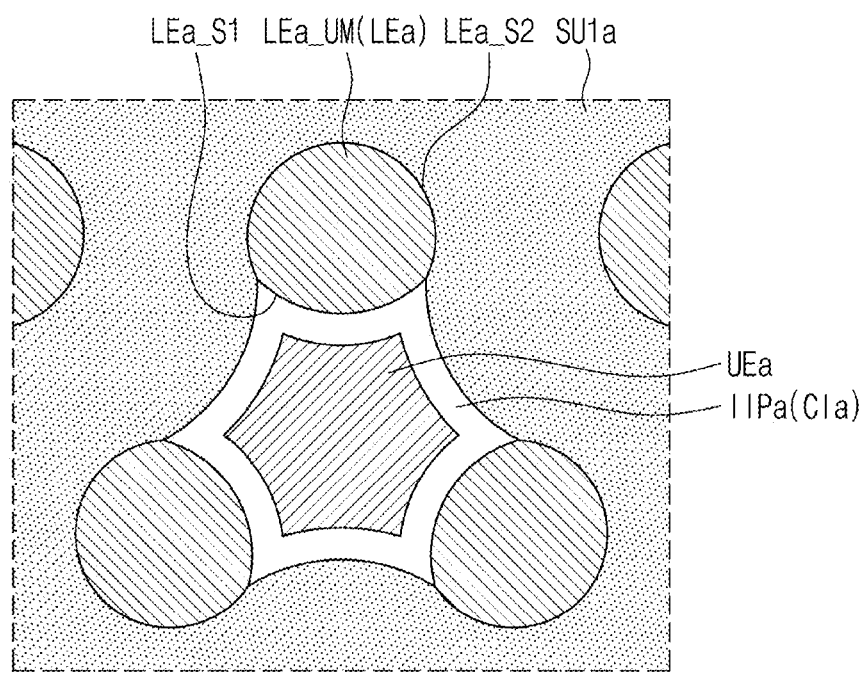
FIGS. 5A, 5B, and 5C are diagrams illustrating a semiconductor device according to an embodiment.
Figure 5A:
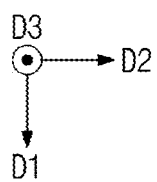
Figure 5B:
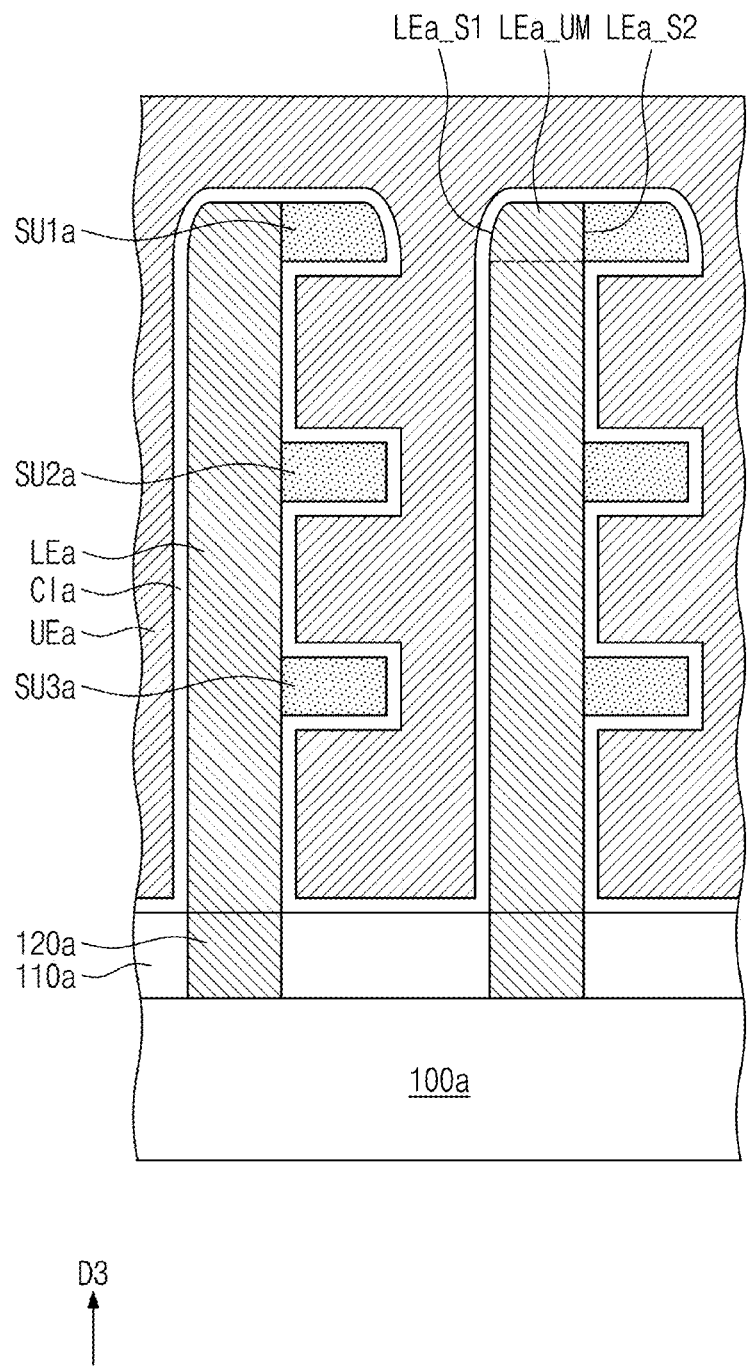
Figure 5C:
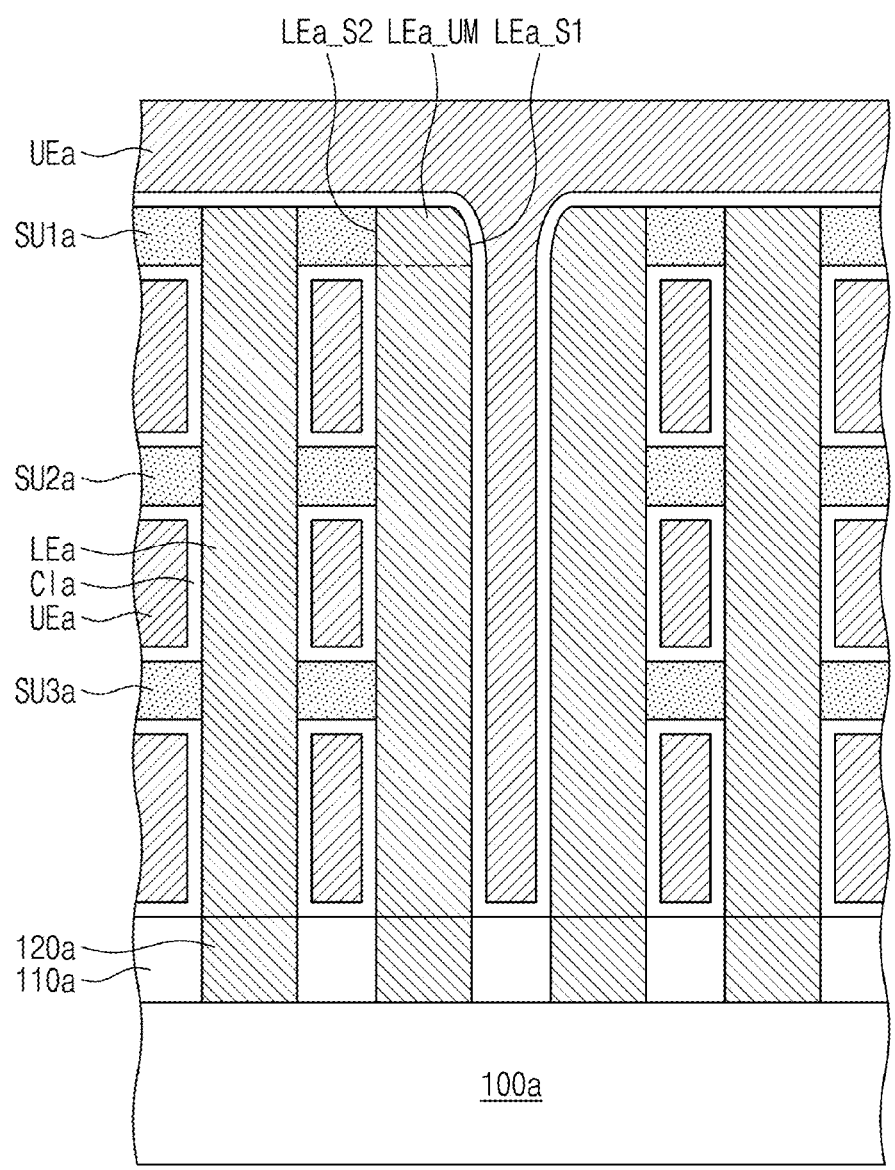

FIGS. 5A, 5B, and 5C are diagrams illustrating a semiconductor device according to an embodiment. For example, FIG. 5A is a diagram illustrating a structure of a first supporter of a semiconductor device at a level of a top surface of the first supporter.

Referring to FIGS. 5A, 5B, and 5C, the semiconductor device may include the substrate 100a, the interlayer insulating layer 110a, the capacitor contact structures 120a, the lower electrodes LEa, the first supporter SU1a, the second supporter SU2a, the third supporter SU3a, the capacitor insulating layer CIa, and the upper electrode UEa.

The capacitor insulating layer CIa may include an intervening insulating portion IIPa, which is disposed at the same level as the first supporter SU1a. An uppermost portion LEa_UM of the lower electrode LEa may include a first sidewall LEa_S1 and a second sidewall LEa_S2. The uppermost portion LEa_UM may be a portion of the lower electrode Lea, which is disposed at the same level as the first supporter SU1a and the intervening insulating portion IIPa.

The first sidewall LEa_S1 of the uppermost portion LEa_UM of the lower electrode LEa may be in contact with the intervening insulating portion IIPa of the capacitor insulating layer CIa. The second sidewall LEa_S2 of the uppermost portion LEa_UM of the lower electrode LEa may be in contact with the first supporter SU1a. Each of the first and second sidewalls LEa_S1 and LEa_S2 of the uppermost portion LEa_UM of the lower electrode Lea may have a curved shape.

When viewed in a sectional view, the first sidewall LEa_S1 of the uppermost portion LEa_UM of the lower electrode Lea may have a curved shape, as shown in FIGS. 5B and 5C. When viewed in the sectional view, the second sidewall LEa_S2 of the uppermost portion LEa_UM of the lower electrode Lea may be flat, as shown in FIGS. 5B and 5C. A width of the uppermost portion LEa_UM of the lower electrode Lea may be increased as a vertical level is lowered.

When viewed in the plan view of FIG. 5A, a curvature radius of the first sidewall LEa_S1 of the uppermost portion LEa_UM of the lower electrode LEa may be large than a curvature radius of the second sidewall LEa_S2 of the uppermost portion LEa_UM of the lower electrode LEa.

An etch selectivity of the first supporter SU1a and the lower electrode Lea may be low in a process of etching the first supporter SU1a, and in this case, the uppermost portion LEa_UM of the lower electrode LEa may be etched along with the first supporter SU1a, and as a result, the first sidewall LEa_S1 of the uppermost portion LEa_UM of the lower electrode LEa may be formed.

Figure 6A:
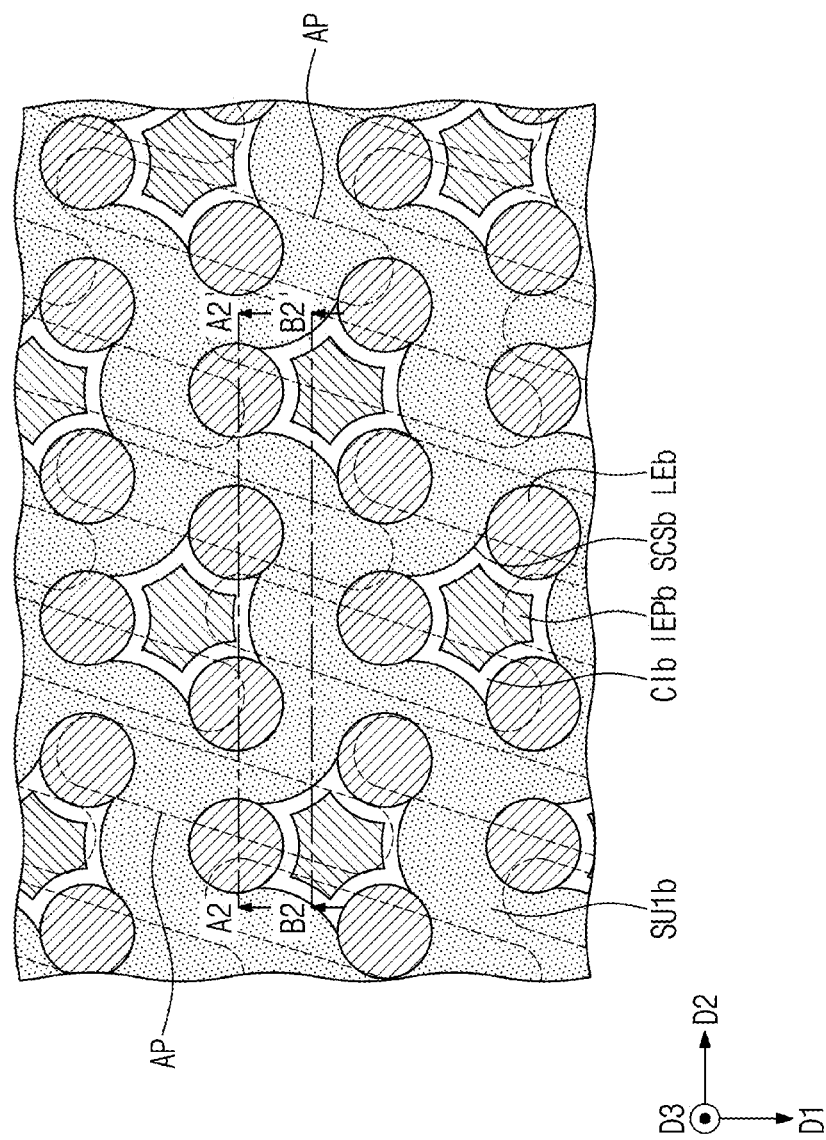
FIG. 6A is a plan view illustrating a semiconductor device according to an embodiment.
Figure 6B:
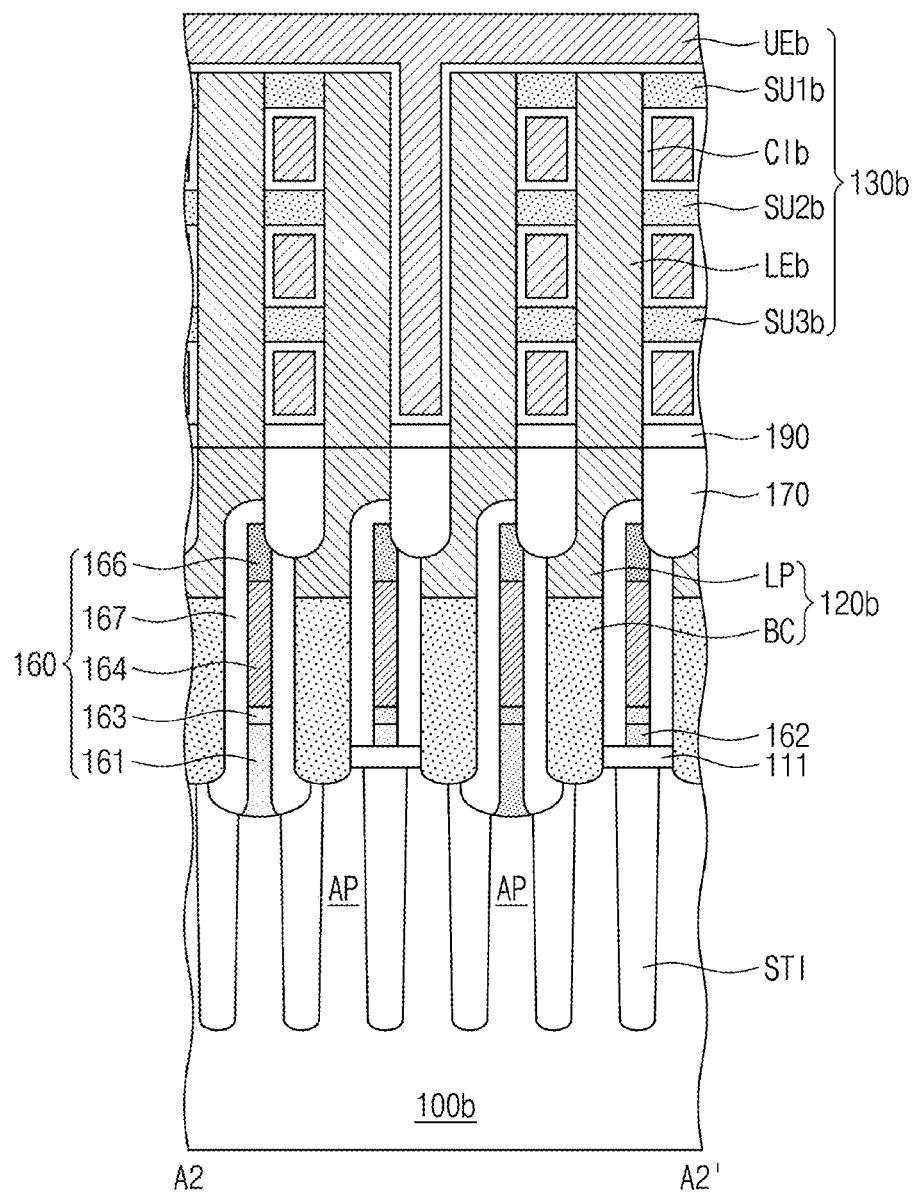
FIG. 6B is a sectional view taken along a line A2-A2' of FIG. 6A.
Figure 6C:
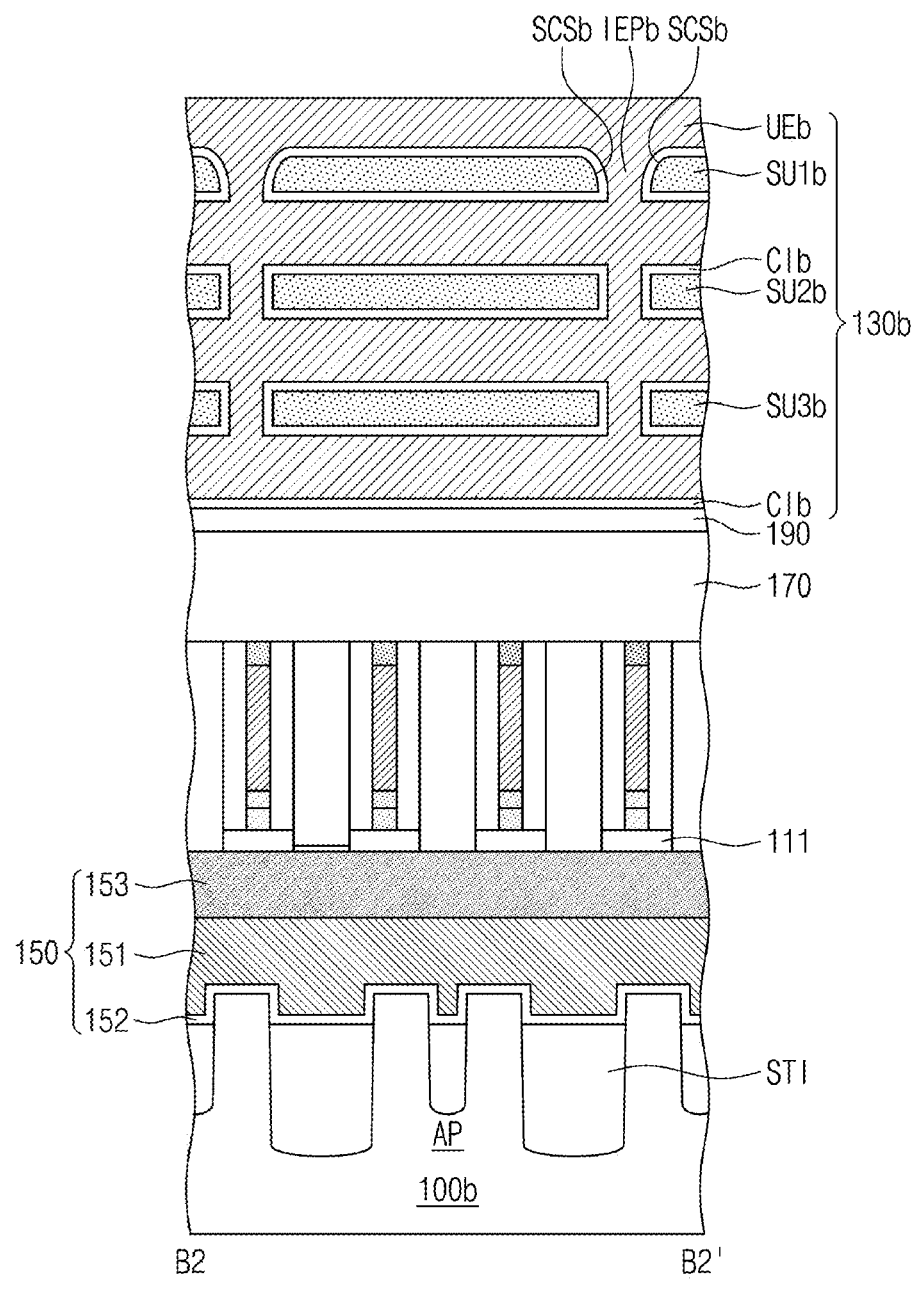
FIG. 6C is a sectional view taken along a line B2-B2' of FIG. 6A.

FIG. 6A is a plan view illustrating a semiconductor device according to an embodiment. FIG. 6B is a sectional view taken along a line A2-A2' of FIG. 6A. FIG. 6C is a sectional view taken along a line B2-B2' of FIG. 6A.

Referring to FIGS. 6A, 6B, and 6C, the semiconductor device may include the substrate 100b. In an embodiment, the substrate 100b may be a semiconductor substrate. In an embodiment, the substrate 100b may be a silicon-on-insulator (SOI) substrate or a germanium-on-insulator (GOI) substrate.

The substrate 100b may include active patterns AP. Upper portions of the substrate 100b, which protrude in the third direction D3, may be defined as the active patterns AP. The active patterns AP may be spaced apart from each other.

A device isolation layer STI may be provided in a space between the active patterns AP. The device isolation layer STI may be provided in the substrate 100b. The active patterns AP may be defined by the device isolation layer STI. Each of the active patterns AP may be surrounded by the device isolation layer STI. The device isolation layer STI may be formed of or include at least one of insulating materials. As an example, the device isolation layer STI may be formed of or include oxide.

Gate structures 150, which extend in the second direction D2, may be provided. The gate structures 150 may be arranged in the first direction D1. The gate structure 150 may be provided on the device isolation layer STI and the active patterns AP. The gate structure 150 may be provided to have a buried gate structure that is buried in the active patterns AP and the device isolation layer STI. The active patterns AP may include impurity regions. A cell transistor may be defined by the gate structure 150 and the active pattern AP.

The gate structure 150 may include a gate insulating layer 152 on the active pattern AP, a gate electrode 151 on the gate insulating layer 152, and a gate capping layer 153 on the gate electrode 151. The gate insulating layer 152 and the gate capping layer 153 may be formed of or include at least one of insulating materials. As an example, the gate insulating layer 152 may be formed of or include an oxide material, and the gate capping layer 153 may be formed of or include a nitride material. The gate electrode 151 may be formed of or include at least one of conductive materials.

The active pattern AP may include a first portion and two second portions. The first portion of the active pattern AP may be disposed between the two second portions of the active pattern AP. The gate structure 150 may be provided between the first and second portions of the active pattern AP. The first and second portions of the active pattern AP may be spaced apart from each other by the gate structure 150.

Insulating patterns 111 may be provided on the gate structure 150 and the device isolation layer STI. The insulating pattern 111 may be formed of or include at least one of insulating materials. In an embodiment, the insulating pattern 111 may include a plurality of insulating layers.

Bit line structures 160 that extend in the first direction D, may be provided. The bit line structures 160 may be arranged in the second direction D2. The bit line structures 160 may be provided on the insulating pattern 111 and the active pattern AP. The bit line structure 160 may be electrically connected to the active pattern AP.

Each of the bit line structures 160 may include bit line contacts 161, first conductive layers 162, a second conductive layer 163, a third conductive layer 164, a bit line capping layer 166, and a bit line spacer 167.

The bit line contacts 161 of the bit line structure 160 may be arranged in the first direction D1. The first conductive layers 162 of the bit line structure 160 may be arranged in the first direction D1. The bit line contacts 161 and the first conductive layers 162 of the bit line structure 160 may be alternately disposed in the first direction D1. The bit line contact 161 may be disposed on the first portion of the active pattern AP. The bit line contact 161 may be provided to penetrate the insulating pattern 111. The first conductive layer 162 may be provided on the insulating pattern 111. The bit line contact 161 and the first conductive layer 162 may be formed of or include at least one of conductive materials. As an example, the bit line contact 161 and the first conductive layer 162 may be formed of or include polysilicon. In an embodiment, the bit line contacts 161 and the first conductive layers 162, which are provided in each bit line structure 160, may be connected to each other to form a single object, in which an interface is not formed.

The second conductive layer 163 may be provided on the bit line contacts 161 and the first conductive layers 162. The third conductive layer 164 may be provided on the second conductive layer 163. The bit line capping layer 166 may be provided on the third conductive layer 164. The second conductive layer 163 and the third conductive layer 164 may be formed of or include at least one of conductive materials. As an example, the second conductive layer 163 may be formed of or include polysilicon, and the third conductive layer 164 may be formed of or include at least one of metallic materials. The bit line capping layer 166 may be formed of or include at least one of insulating materials. As an example, the bit line capping layer 166 may be formed of or include a nitride material. In an embodiment, the number of the conductive layers constituting each bit line structure 160 may be greater or less than that in the illustrated structure.

The bit line spacer 167 may be provided to cover the top and side surfaces of the bit line capping layer 166, the side surfaces of the first to third conductive layers 162, 163, and 164, and the side surfaces of the bit line contacts 161. The bit line spacer 167 may be formed of or include at least one of insulating materials. In an embodiment, the bit line spacer 167 may include a plurality of insulating layers.

The capacitor contact structure 120b, which is electrically connected to the active pattern AP of the substrate 100b, may be provided. The capacitor contact structure 120b may include a storage node contact BC and a landing pad LP.

The storage node contact BC may be provided on the active pattern AP. The storage node contact BC may be provided between the bit line structures 160, which are adjacent to each other. The storage node contact BC may be provided on a side surface of the bit line structure 160. The storage node contact BC may be formed of or include at least one of conductive materials. As an example, the storage node contact BC may be formed of or include polysilicon.

Landing pads LP may be provided. The landing pad LP may be provided on the storage node contact BC. The landing pad LP may be formed of or include at least one of conductive materials. As an example, the landing pad LP may be formed of or include at least one of metallic materials. In an embodiment, a metal silicide layer and a barrier layer may be provided between the storage node contact BC and the landing pad LP.

Insulating fences 180 may be provided. The insulating fence 180 may be provided on the gate capping layer 153 of the gate structure 150. The insulating fence 180 may be provided between the bit line structures 160, which are adjacent to each other in the second direction D2. The insulating fence 180 may be formed of or include at least one of insulating materials.

A filling pattern 170 may be provided on the insulating fence 180. The filling pattern 170 may be provided to separate the landing pads LP from each other. The filling pattern 170 may be provided to enclose the landing pad LP. The filling pattern 170 may be formed of or include at least one of insulating materials.

An etch stop layer 190 may be provided on the filling pattern 170. The etch stop layer 190 may be formed of or include at least one of insulating materials.

The capacitor structure 130b may be provided. The capacitor structure 130b may include the lower electrodes LEb, the first supporter SU1b, the second supporter SU2b, the third supporter SU3b, the capacitor insulating layer CIb, and the upper electrode UEb.

The upper electrode UEb may include an intervening electrode portion IEPb, which is disposed at the same level as the first supporter SU1b. The first supporter SU1b may include the supporter curved sidewall SCSb, which is convex toward the intervening electrode portion IEPb of the upper electrode UEb.

Figure 7A:
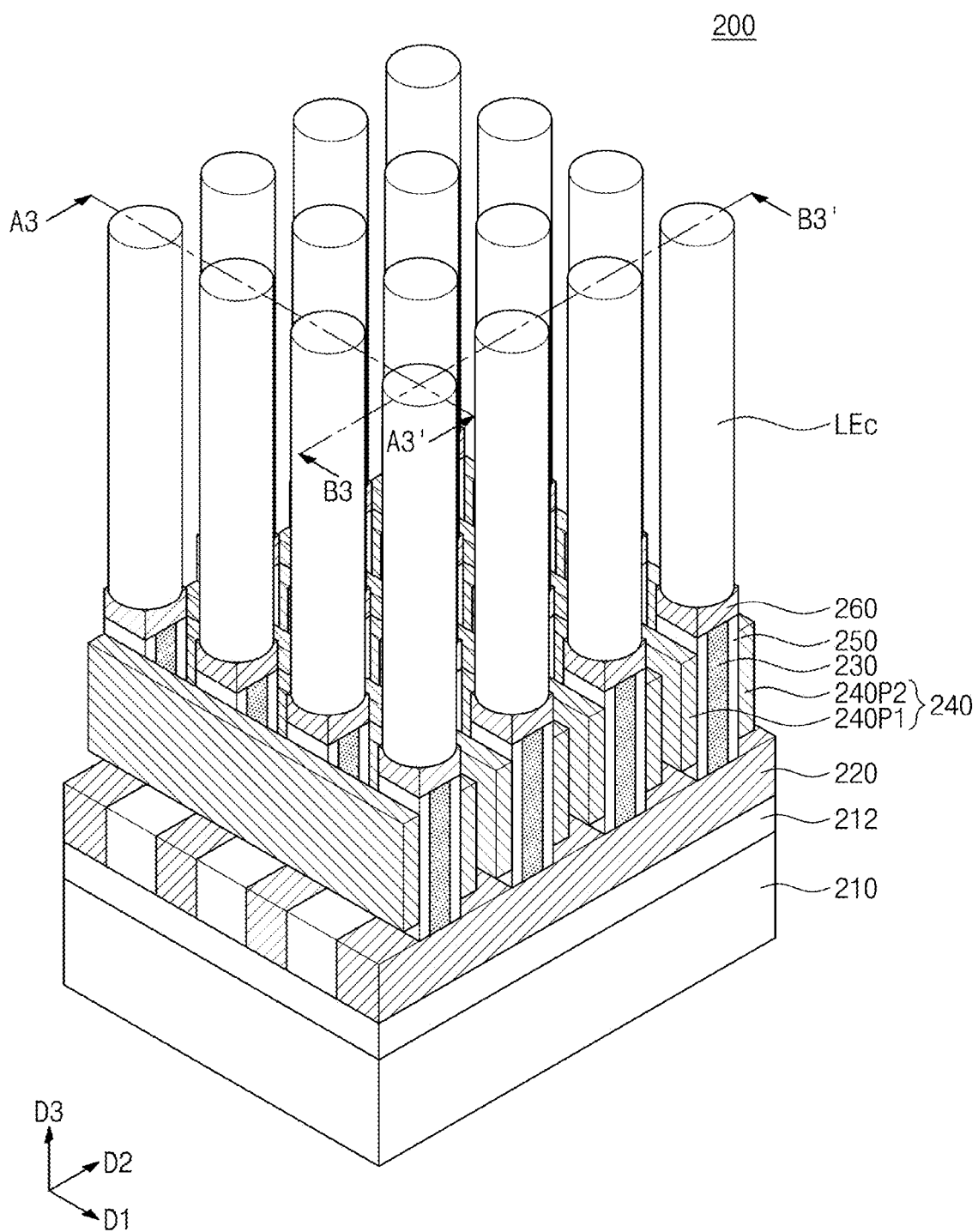
FIG. 7A is a perspective view illustrating a semiconductor device according to an embodiment.
Figure 7B:
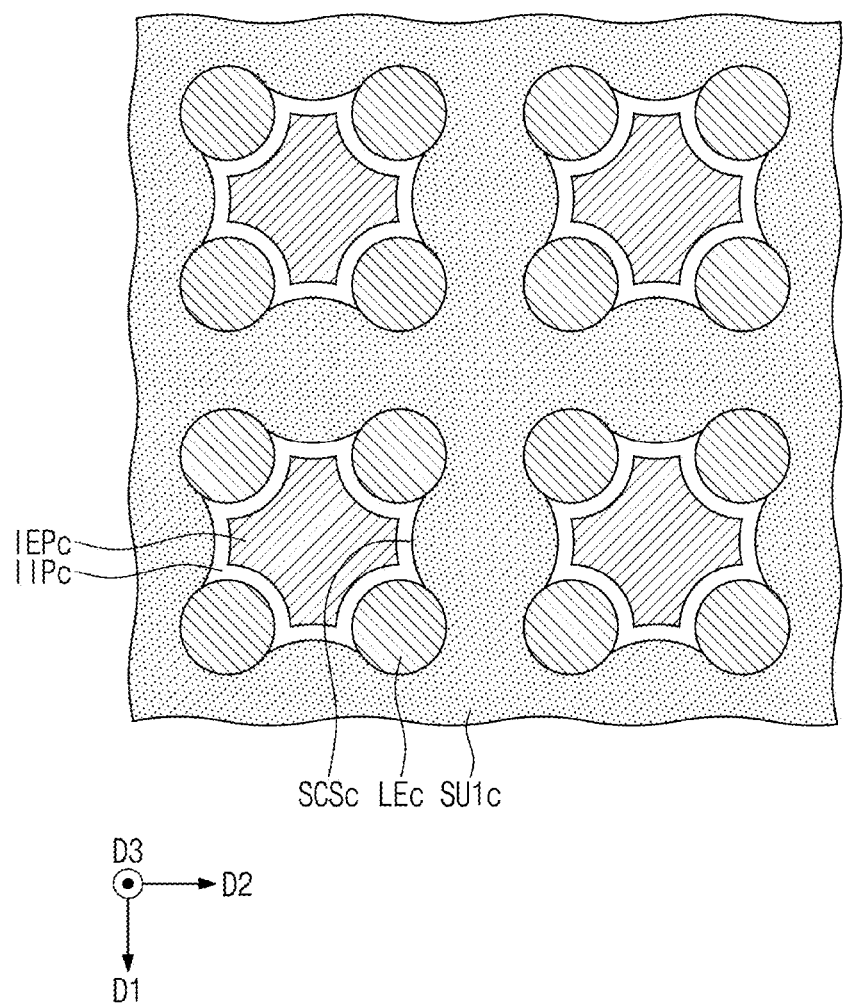
FIG. 7B is a plan view of the semiconductor device of FIG. 7A.
Figure 7C:
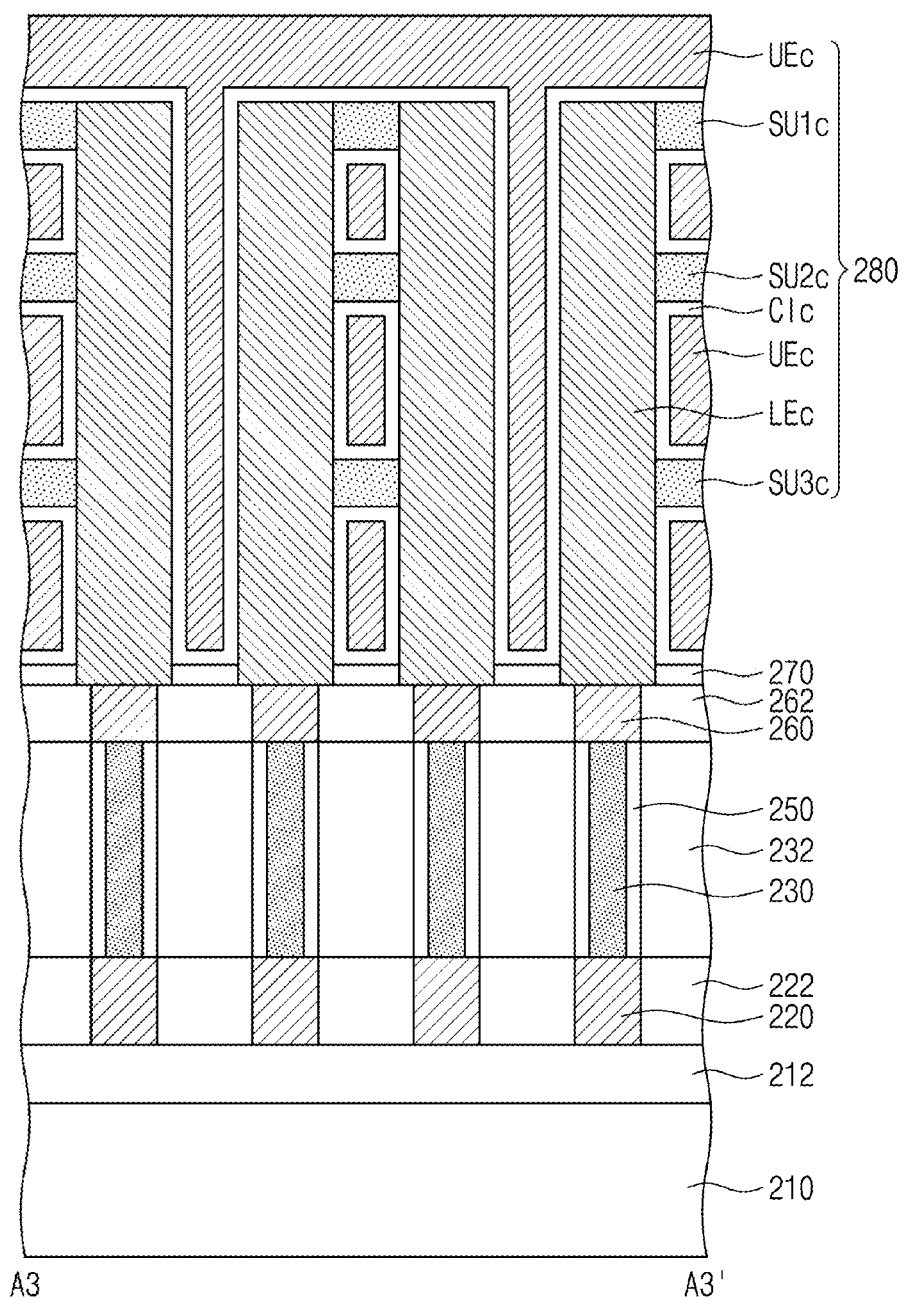
FIG. 7C is a sectional view taken along a line A3-A3' of FIG. 7A.
Figure 7D:
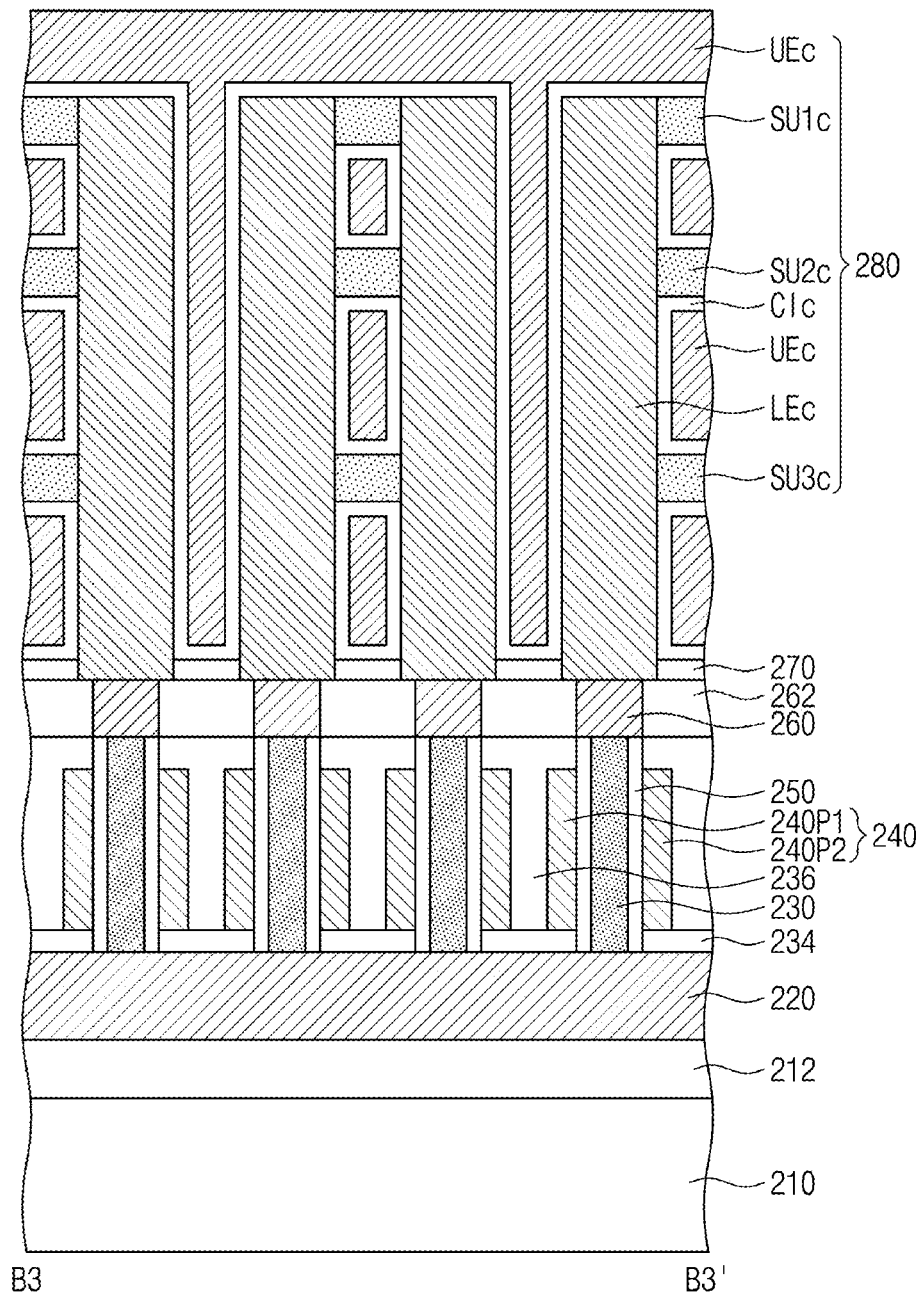
FIG. 7D is a sectional view taken along a line B3-B3' of FIG. 7A.

FIG. 7A is a perspective view illustrating a semiconductor device according to an embodiment. FIG. 7B is a plan view of the semiconductor device of FIG. 7A. FIG. 7C is a sectional view taken along a line A3-A3' of FIG. 7A. FIG. 7D is a sectional view taken along a line B3-B3' of FIG. 7A.

Referring to FIGS. 7A, 7B, 7C, and 7D, a semiconductor device 200 may include a substrate 210, a plurality of first conductive lines 220, an active pattern 230, a gate electrode 240, a gate insulating layer 250, and a capacitor structure 280. The semiconductor device 200 may be a memory device including a vertical channel transistor (VCT). Herein, the term "vertical channel transistor" refers to a transistor structure in which the active pattern 230 extends from the substrate 210 in a vertical direction, or which has a channel length defined in the vertical direction.

A lower insulating layer 212 may be disposed on the substrate 210. The first conductive lines 220, which are spaced apart from each other in the first direction D1 and are extended in the second direction D2 and may be disposed on the lower insulating layer 212. A plurality of first insulating structures 222 may be disposed on the lower insulating layer 212 to fill a space between the first conductive lines 220. The first insulating structures 222 (see FIG. 7C) may extend in the second direction D2 and may have top surfaces that are located at the same level as a top surface of the first conductive lines 220. The first conductive lines 220 may serve as a bit line of the semiconductor device 200.

In an embodiment, the first conductive lines 220 may be formed of or include at least one of doped polysilicon, metals, conductive metal nitrides, conductive metal silicides, conductive metal oxides, or combinations thereof. For example, the first conductive lines 220 may be formed of or include at least one of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof, but embodiments are not limited to these materials. The first conductive lines 220 may have a single- or multi-layered structure, which is formed of or includes the afore-described materials. In an embodiment, the first conductive lines 220 may include at least one of two-dimensional semiconductor materials (e.g., graphene, carbon nanotube, or combinations thereof).

The active pattern 230 may be arranged on the first conductive lines 220 to be spaced apart from each other in the first and second directions D1 and D2 or to form a matrix shape. The active pattern 230 may have a first width in the first direction D1 and a first height in the third direction D3. The first height may be larger than the first width. For example, the first height may be about 2 to 10 times the first width, but embodiments are not limited to this example. A bottom portion of the active pattern 230 may serve as a first source/drain region (not shown), an upper portion of the active pattern 230 may serve as a second source/drain region (not shown), and a portion of the active pattern 230 between the first and second source/drain regions may serve as a channel region (not shown).

In an embodiment, the active pattern 230 may be formed of or include at least one of oxide semiconductor materials (e.g., $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$, or combinations thereof). The active pattern 230 may have a single- or multi-layered structure that is formed of or includes at least one of the oxide semiconductor materials. In an embodiment, the active pattern 230 may have a band gap energy that is higher than that of silicon. For example, the active pattern 230 may have a band gap energy of about 1.5 eV to 5.6 eV. For example, the active pattern 230 may exhibit an optimized channel performance when it has a band gap energy of about 2.0 eV to 4.0 eV. In an embodiment, the active pattern 230 may have a polycrystalline or amorphous structure, but embodiments are not limited to this example. In an embodiment, the active pattern 230 may be formed of or include at least one of two-dimensional semiconductor materials (e.g., graphene, carbon nanotube, or combinations thereof).

The gate electrode 240 may be provided on opposite side surfaces of the active pattern 230 and may extend in the first direction D1. The gate electrode 240 may include a first sub-gate electrode 240P1, which is provided to face a first sidewall of the active pattern 230, and a second sub-gate electrode 240P2, which is provided to face a second sidewall of the active pattern 230 opposite to the first sidewall. When one active pattern 230 is disposed between the first sub-gate electrode 240P1 and the second sub-gate electrode 240P2, at least one of transistors in the semiconductor device 200 may have a dual gate structure. In an embodiment, at least one or all of transistors in the semiconductor device 200 may be provided to have a single gate structure in which only the first sub-gate electrode 240P1 (i.e., without the second sub-gate electrode 240P2) is formed to face the first sidewall of the active pattern 230.

The gate electrode 240 may be formed of or include at least one of doped polysilicon, metals, conductive metal nitrides, conductive metal silicides, conductive metal oxides, or combinations thereof. For example, the gate electrode 240 may be formed of or include at least one of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof, as non-limited examples.

The gate insulating layer 250 may be interposed between the active pattern 230 and the gate electrode 240 to enclose the sidewall of the active pattern 230. For example, the entire sidewall of the active pattern 230 may be enclosed by the gate insulating layer 250. A portion of the sidewall of the gate electrode 240 may be in contact with the gate insulating layer 250. In an embodiment, the gate insulating layer 250 may extend in an extension direction of the gate electrode 240, and only two opposites ones of the sidewalls of the active pattern 230, which face the gate electrode 240, may be in contact with the gate insulating layer 250.

In an embodiment, the gate insulating layer 250 may include at least one of a silicon oxide layer, a silicon oxynitride layer, a high-k dielectric layer having a dielectric constant higher than the silicon oxide layer, or combinations thereof. The high-k dielectric layer may be formed of or include at least one of metal oxide materials or a metal oxynitride material. For example, high-k dielectric materials (e.g., $HfO_2$, HfSiO, HfSiON, HfTaO, HfSiO, HfZrO, $ZrO_2$, $Al_2O_3$, or combinations thereof) may be used as the gate insulating layer 250, as non-limiting examples.

A plurality of second insulating structures 232 may be provided on the first insulating structures 222 and may extend in the second direction D2. The active pattern 230 may be disposed between two adjacent ones of the second insulating structures 232. In addition, a first gap-fill layer 234 and a second gap-fill layer 236 may be disposed in a space between two adjacent ones of the second insulating structures 232 and between two adjacent ones of the active patterns 230. The first gap-fill layer 234 may be disposed in a lower portion of the space between the two adjacent ones of the active patterns 230, and the second gap-fill layer 236 may be formed on the first gap-fill layer 234 to fill the remaining portion of the space between the two adjacent ones of the active patterns 230. A top surface of the second gap-fill layer 236 may be located at the same level as the top surface of the active pattern 230. In an embodiment, the second gap-fill layer 236 may cover the top surface of the gate electrode 240. In an embodiment, the second insulating structures 232 may be formed of a layer that is continuously connected to the first insulating structures 222, or the second gapfill layer 236 may be formed of a layer that is continuously connected to the first gapfill layer 234.

A capacitor contact structure 260 may be disposed on the active pattern 230. The capacitor contact structure 260 may be disposed to be vertically overlapped with the active pattern 230 and may be arranged to be spaced apart from each other in the first and second directions D1 and D2 or to form a matrix shape. The capacitor contact structure 260 may be formed of or include at least one of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof, as non-limiting examples. An upper insulating layer 262 may be provided on the second insulating structures 232 and the second gap-fill layer 236 to enclose a side surface of the capacitor contact structure 260.

An etch stop layer 270 may be disposed on the upper insulating layer 262, and the capacitor structure 280 may be disposed on the etch stop layer 270. The capacitor structure 280 may include the lower electrodes LEc, the capacitor insulating layer CIc, the upper electrode UEc, the first supporter SU1c, the second supporter SU2c, and the third supporter SU3c.

The upper electrode UEc may include an intervening electrode portion IEPc, which is disposed at the same level as the first supporter SU1c. The capacitor insulating layer CIc may include an intervening insulating portion IIPc, which is disposed at the same level as the first supporter SU1c. The intervening insulating portion IIPc may be provided to enclose the intervening electrode portion IEPc. The intervening insulating portion IIPc may be in contact with four lower electrodes LEc, which are adjacent to each other.

The first supporter SU1c may include a supporter curved sidewall SCSc, which is convex toward the intervening electrode portion IEPc of the upper electrode UEc. The intervening electrode portion IEPc of the upper electrode UEc may be enclosed by four supporter curved sidewalls SCSc. The intervening insulating portion IIPc of the capacitor insulating layer CIc may be in contact with the four supporter curved sidewalls SCSc.

In a semiconductor device according to an embodiment, it may be possible to increase a misalignment margin between a lower electrode and a supporter curved sidewall.

Furthermore, according to an embodiment, it may be possible to prevent or suppress a bridge disturbance issue from occurring between the lower electrodes.

Accordingly, embodiments may provide a semiconductor device with improved reliability and electrical characteristics and a method of fabricating the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
an active pattern;
a capacitor contact structure electrically connected to the active pattern; and
a capacitor structure electrically connected to the capacitor contact structure,
wherein the capacitor structure includes:
a first lower electrode and a second lower electrode, which are adjacent to each other;
a supporter supporting the first and second lower electrodes;
a capacitor insulating layer covering the first and second lower electrodes; and
an upper electrode on the capacitor insulating layer,
wherein the supporter includes a first supporter curved sidewall connected to the first lower electrode and the second lower electrode,
wherein the upper electrode includes an intervening electrode portion enclosed by the supporter, and
wherein the first supporter curved sidewall is convex toward the intervening electrode portion.

2. The semiconductor device as claimed in claim 1, further including:
a third lower electrode adjacent to the first and second lower electrodes, wherein:
the supporter further includes a second supporter curved sidewall that is connected to the first lower electrode and the third lower electrode, and
a distance between the first supporter curved sidewall and the second supporter curved sidewall decreases as a vertical level is lowered.

3. The semiconductor device as claimed in claim 2, wherein:
the capacitor insulating layer includes a first insulating curved outer sidewall in contact with the first supporter curved sidewall and a second insulating curved outer sidewall in contact with the second supporter curved sidewall, and
a distance between the first insulating curved outer sidewall and the second insulating curved outer sidewall decreases as a vertical level is lowered.

4. The semiconductor device as claimed in claim 3, wherein the first insulating curved outer sidewall and the second insulating curved outer sidewall are concave toward the intervening electrode portion.

5. The semiconductor device as claimed in claim 1, wherein:
the first supporter curved sidewall includes a first portion adjacent to the first lower electrode and a second portion adjacent to the second lower electrode, and
a distance between the first portion of the first supporter curved sidewall and a center of the intervening electrode portion decreases as a distance from the first lower electrode increases.

6. The semiconductor device as claimed in claim 5, wherein a distance between the second portion of the first supporter curved sidewall and the center of the intervening electrode portion decreases as a distance from the second lower electrode increases.

7. The semiconductor device as claimed in claim 1, wherein:
the uppermost portion of the first lower electrode includes a first sidewall in contact with the capacitor insulating layer and a second sidewall in contact with the supporter, and
a curvature radius of the first sidewall of the uppermost portion of the first lower electrode is larger than a curvature radius of the second sidewall of the uppermost portion of the first lower electrode.

8. The semiconductor device as claimed in claim 1, wherein a width of the intervening electrode portion decreases as a vertical level is lowered.

9. The semiconductor device as claimed in claim 1, wherein a top surface of the supporter is located at substantially the same level as top surfaces of the first and second lower electrodes.

10. A semiconductor device, comprising:
an active pattern;
a capacitor contact structure electrically connected to the active pattern; and
a capacitor structure electrically connected to the capacitor contact structure,
wherein the capacitor structure includes:
a first lower electrode, a second lower electrode, and a third lower electrode, which are adjacent to each other;
a first supporter supporting the first to third lower electrodes;

a capacitor insulating layer covering the first to third lower electrodes; and an upper electrode on the capacitor insulating layer, wherein the first supporter includes a first supporter curved sidewall, which is connected to the first lower electrode and the second lower electrode, and a second supporter curved sidewall, which is connected to the first lower electrode and the third lower electrode, wherein a distance between the first supporter curved sidewall and the second supporter curved sidewall decreases as a vertical level is lowered.

11. The semiconductor device as claimed in claim 10, wherein a top surface of the first supporter is substantially coplanar with top surfaces of the first to third lower electrodes.

12. The semiconductor device as claimed in claim 10, wherein:
the upper electrode includes an intervening electrode portion, which is disposed at the same level as the first supporter, and
the first supporter curved sidewall and the second supporter curved sidewall are convex toward the intervening electrode portion.

13. The semiconductor device as claimed in claim 10, further including a second supporter below the first supporter, wherein supporter curved sidewalls of the second supporter are concave.

14. The semiconductor device as claimed in claim 13, wherein:
the capacitor insulating layer includes an intervening insulating portion in contact with the supporter curved sidewalls of the second supporter, and
the intervening insulating portion has a ring shape.

15. The semiconductor device as claimed in claim 14, wherein:
the upper electrode includes an intervening electrode portion enclosed by the intervening insulating portion of the capacitor insulating layer, and
the intervening electrode portion has a circular shape.

16. The semiconductor device as claimed in claim 10, wherein:
the capacitor insulating layer includes an insulating curved outer sidewall in contact with the first supporter curved sidewall, and
the insulating curved outer sidewall is concave.

17. The semiconductor device as claimed in claim 10, wherein:
the uppermost portion of the first lower electrode includes a first sidewall in contact with the capacitor insulating layer and a second sidewall in contact with the first supporter, and
a curvature radius of the first sidewall of the uppermost portion of the first lower electrode is larger than a curvature radius of the second sidewall of the uppermost portion of the first lower electrode.

18. The semiconductor device as claimed in claim 17, wherein a width of the uppermost portion of the first lower electrode decreases as a vertical level is lowered.

19. A semiconductor device, comprising:
a substrate including an active pattern;
a gate structure on the active pattern;
a bit line structure on the active pattern;
a capacitor contact structure electrically connected to the active pattern; and
a capacitor structure electrically connected to the capacitor contact structure,
wherein the capacitor structure includes:
a first lower electrode, a second lower electrode, and a third lower electrode, which are adjacent to each other;
a supporter supporting the first to third lower electrodes;
a capacitor insulating layer covering the first to third lower electrodes; and
an upper electrode on the capacitor insulating layer,
wherein the supporter includes a first supporter curved sidewall connected to the first lower electrode and the second lower electrode, a second supporter curved sidewall connected to the second lower electrode and the third lower electrode, and a third supporter curved sidewall connected to the first lower electrode and the third lower electrode,
wherein the upper electrode includes an intervening electrode portion enclosed by the first to third supporter curved sidewalls and the first to third lower electrodes, and
wherein the first to third supporter curved sidewalls are convex toward the intervening electrode portion.

20. The semiconductor device as claimed in claim 19, wherein a distance between the first supporter curved sidewall and the second supporter curved sidewall decreases as a vertical level is lowered.

* * * * *